(12) United States Patent
Pohl et al.

(10) Patent No.: US 11,594,481 B2
(45) Date of Patent: Feb. 28, 2023

(54) PACKAGE, METHOD FOR FORMING A PACKAGE, CARRIER TAPE, CHIP CARD AND METHOD FOR FORMING A CARRIER TAPE

(71) Applicant: Infineon Technologies AG, Neubiberg (DE)

(72) Inventors: Jens Pohl, Bernhardswald (DE); Frank Pueschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/333,313

(22) Filed: May 28, 2021

(65) Prior Publication Data
US 2022/0068789 A1    Mar. 3, 2022

(30) Foreign Application Priority Data
Aug. 27, 2020 (DE) .......................... 102020122437.0

(51) Int. Cl.
| H01L 23/498 | (2006.01) |
| H01L 23/047 | (2006.01) |
| H01L 21/52 | (2006.01) |
| H01L 23/16 | (2006.01) |
| H01L 23/049 | (2006.01) |

(52) U.S. Cl.
CPC ........ *H01L 23/49855* (2013.01); *H01L 21/52* (2013.01); *H01L 23/047* (2013.01); *H01L 23/049* (2013.01); *H01L 23/16* (2013.01)

(58) Field of Classification Search
CPC ............. H01L 23/49855; H01L 23/047; H01L 23/049; H01L 23/16; H01L 21/52
USPC .......................................................... 257/40
See application file for complete search history.

(56) References Cited

U.S. PATENT DOCUMENTS

| 3,942,245 A | * | 3/1976 | Jackson | ............... H01L 23/4985 |
| | | | | 257/E23.032 |
| 5,869,887 A | * | 2/1999 | Urushima | ........... H01L 23/3107 |
| | | | | 257/737 |
| 6,011,697 A | * | 1/2000 | Budnaitis | .............. H01L 23/642 |
| | | | | 361/764 |

(Continued)

FOREIGN PATENT DOCUMENTS

| JP | S62227795 | * | 10/1987 |
| JP | 2005-115513 A | | 4/2005 |

(Continued)

OTHER PUBLICATIONS

German Patent Office, Office Action issued for DE 102020122437.0, 8 pgs., dated Mar. 31, 2021.

*Primary Examiner* — Sheng-Bai Zhu
(74) *Attorney, Agent, or Firm* — Banner & Witcoff Ltd.

(57) ABSTRACT

A package including a frame having an opening for receiving a sensor module, wherein the frame comprises at least one electrical connection which is directed into the opening and which is arranged on an insulation layer applied to the frame, and wherein the insulation layer is connected to the frame at an insertion side of the frame, from which side the sensor module is to be inserted into the opening, and is bent along the inner side of the frame proceeding from the insertion side, such that the at least one electrical connection directed to the opening is electrically couplable to the associated sensor module connection in an arrangement.

18 Claims, 15 Drawing Sheets

(56) References Cited

U.S. PATENT DOCUMENTS

| | | | |
|---|---|---|---|
| 2005/0139685 A1 | 6/2005 | Kozlay | |
| 2011/0154662 A1 | 6/2011 | Droz | |
| 2017/0207182 A1* | 7/2017 | Ho | H01L 23/562 |
| 2018/0138127 A1* | 5/2018 | Lee | H01L 23/562 |
| 2018/0286822 A1* | 10/2018 | Kim | H01Q 1/2283 |
| 2020/0184173 A1 | 6/2020 | Jiang et al. | |

FOREIGN PATENT DOCUMENTS

| | | | |
|---|---|---|---|
| JP | 5743564 | * | 7/2015 |
| WO | 2019044746 | * | 3/2019 |

* cited by examiner

FIG. 1
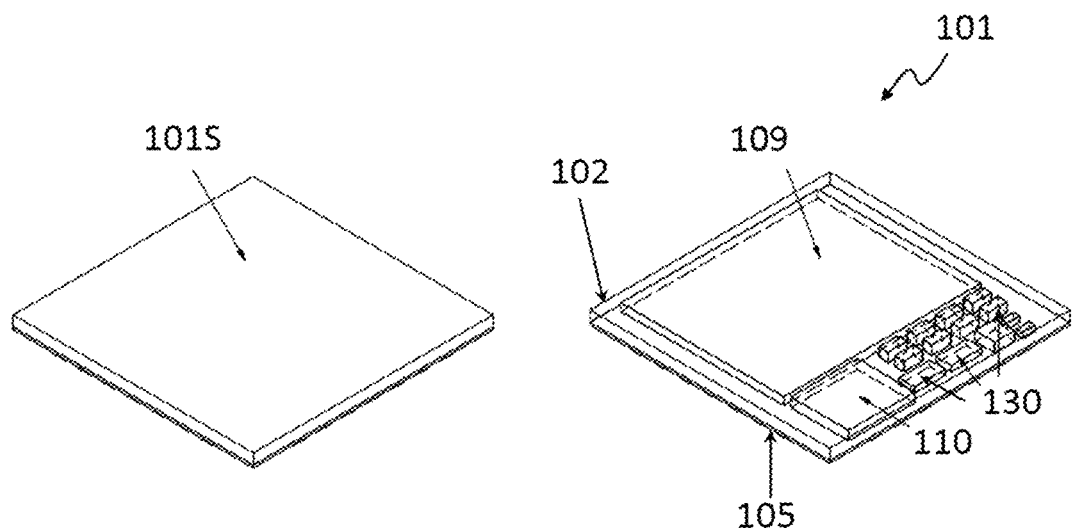
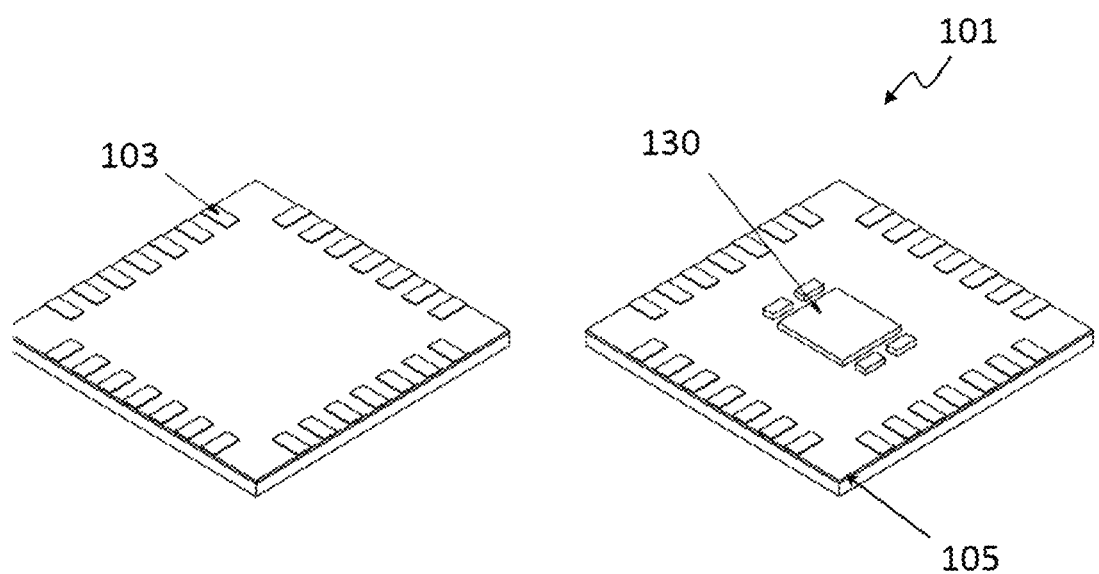

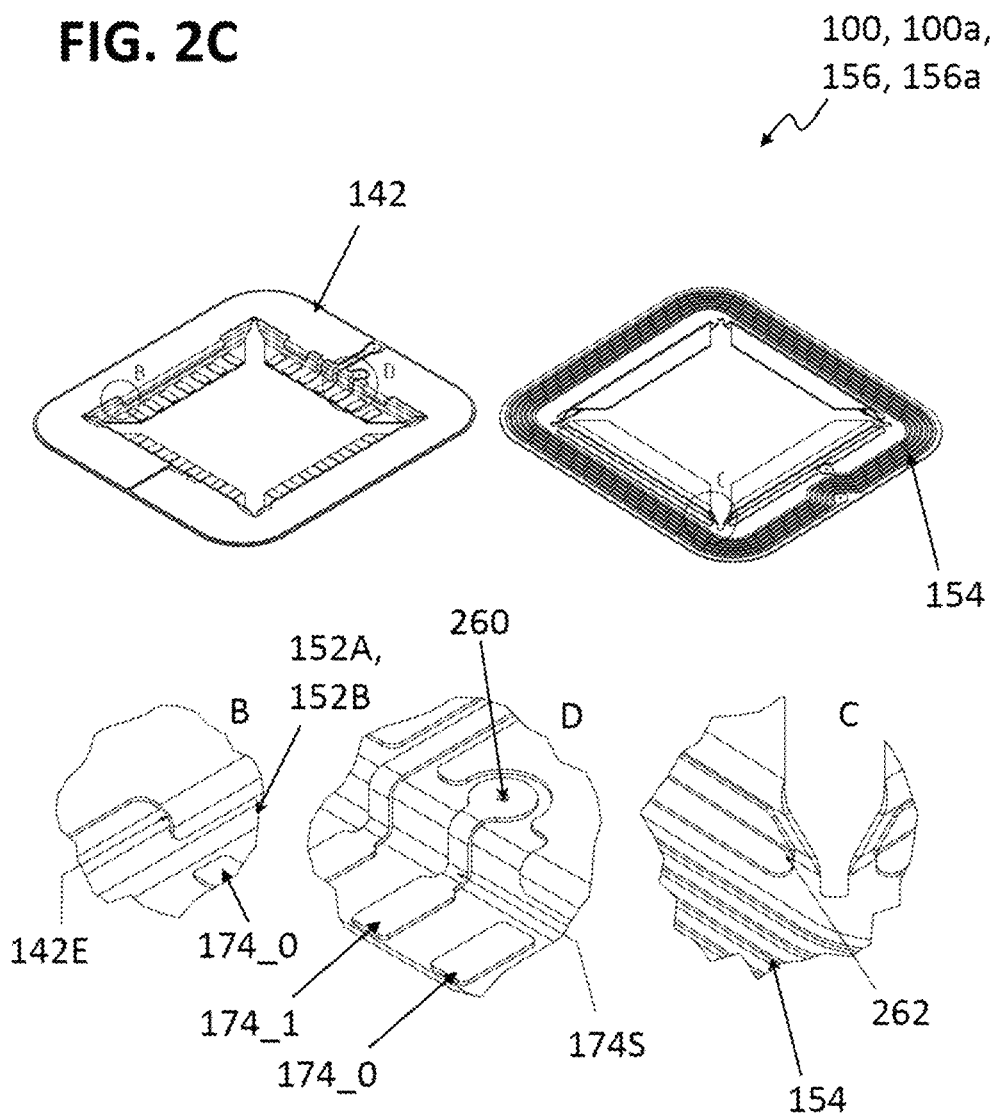

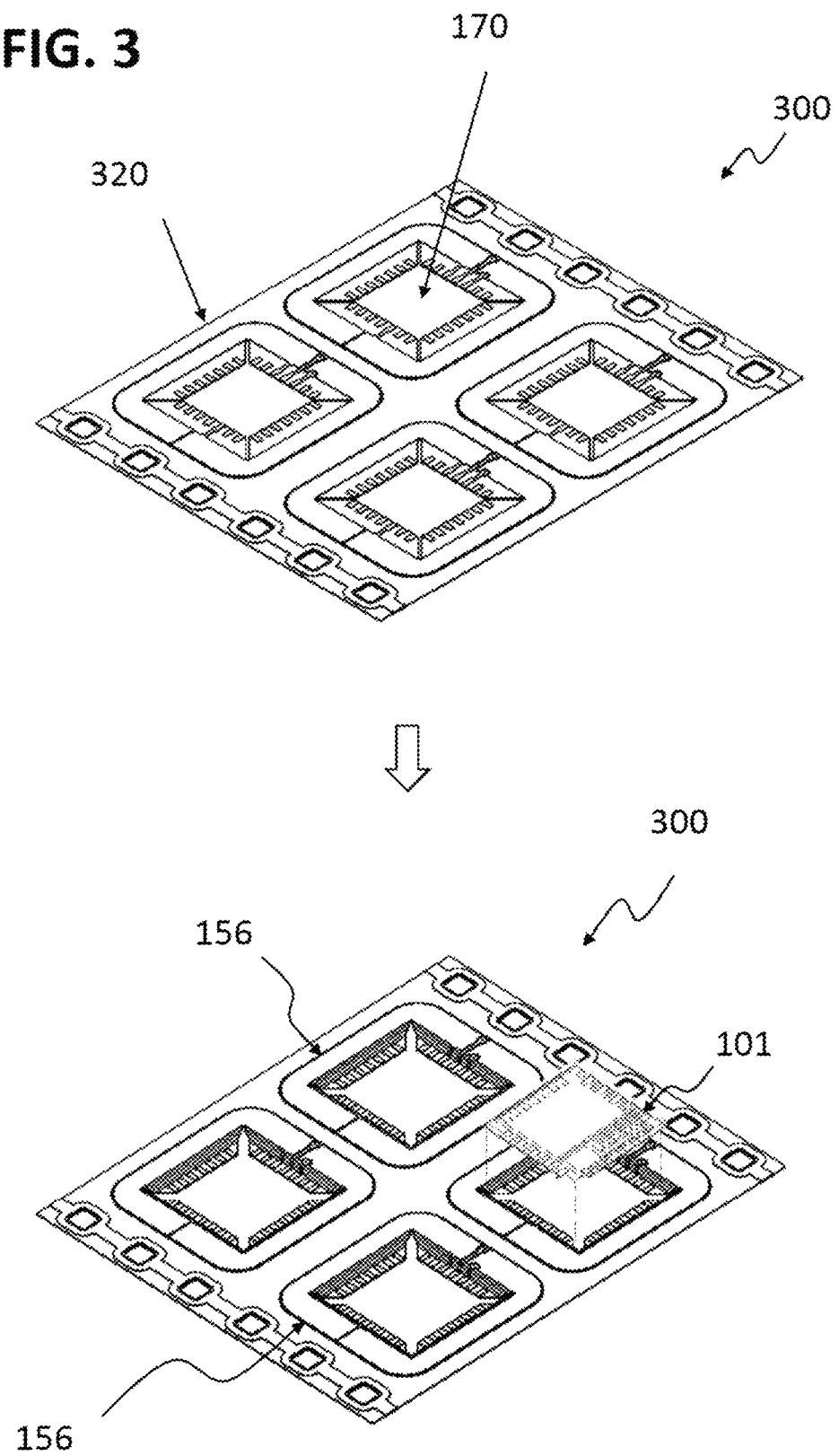

FIG. 5
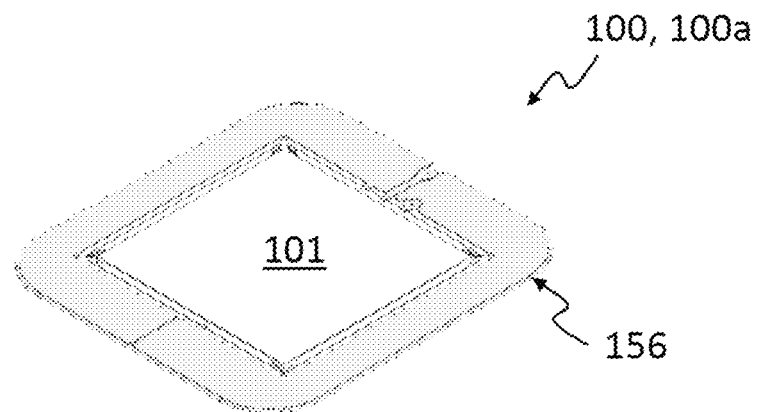
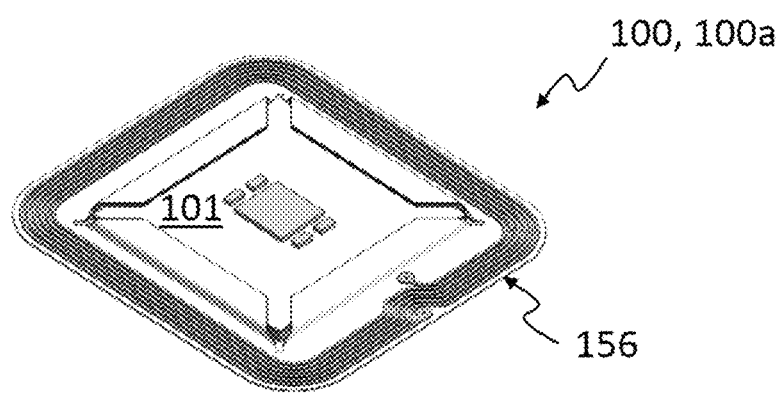
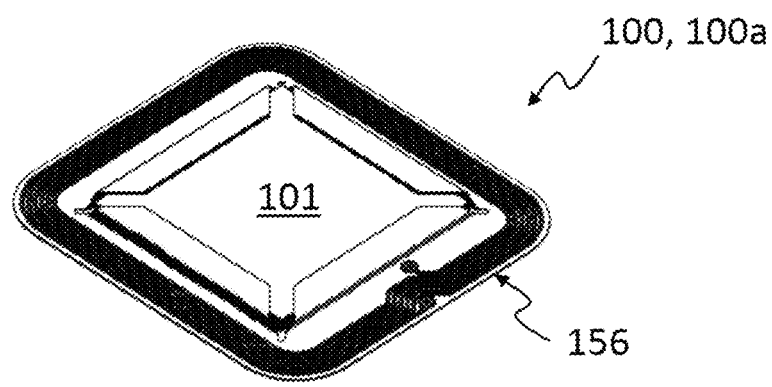

FIG. 6
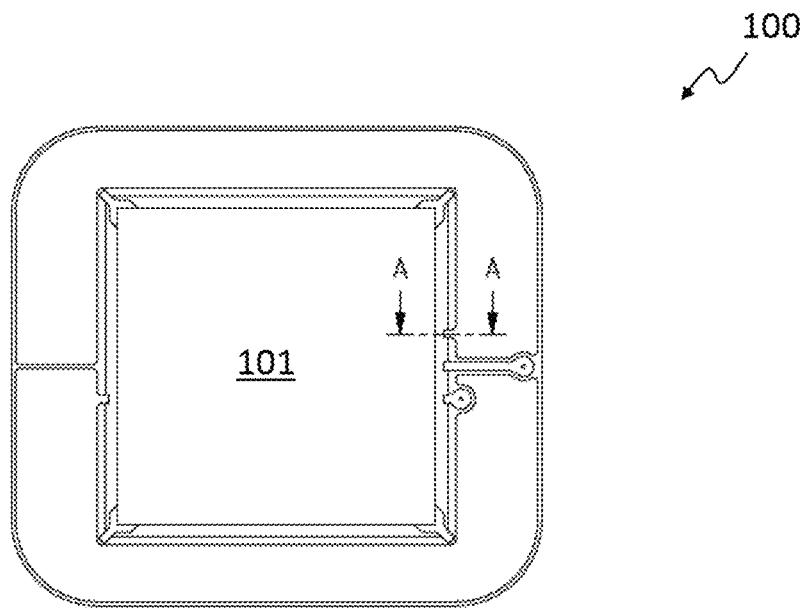
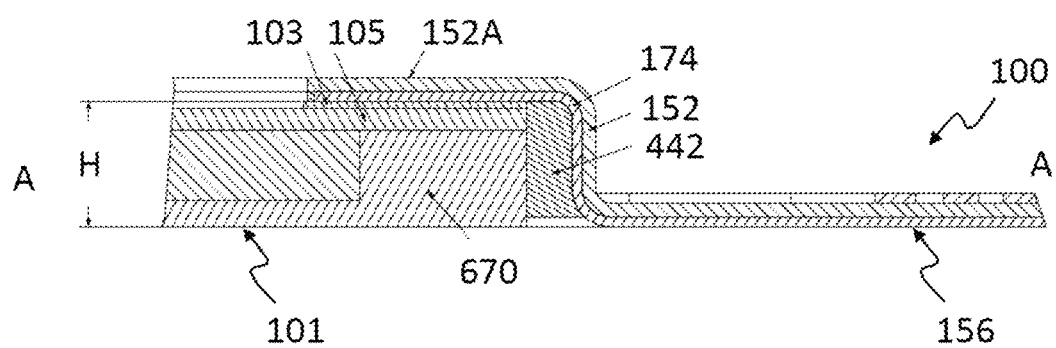

FIG. 9
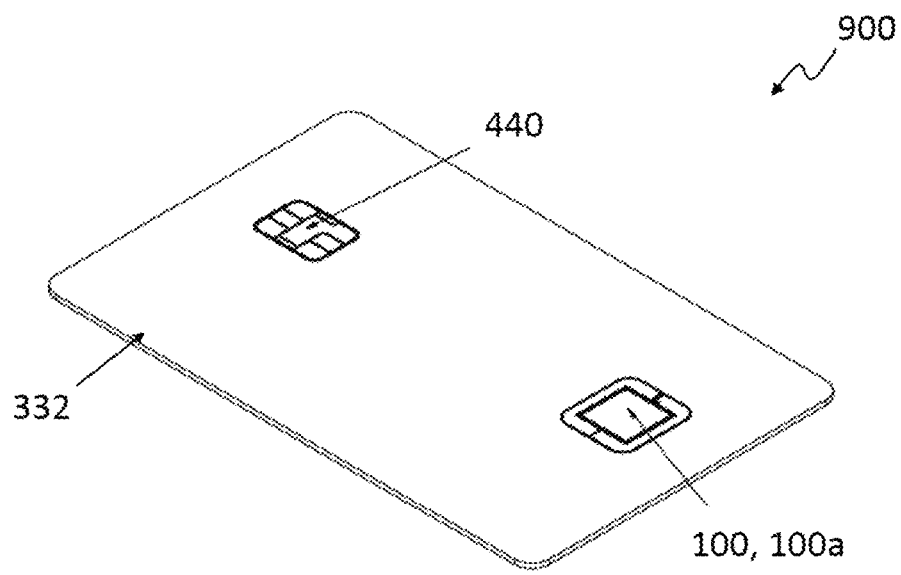
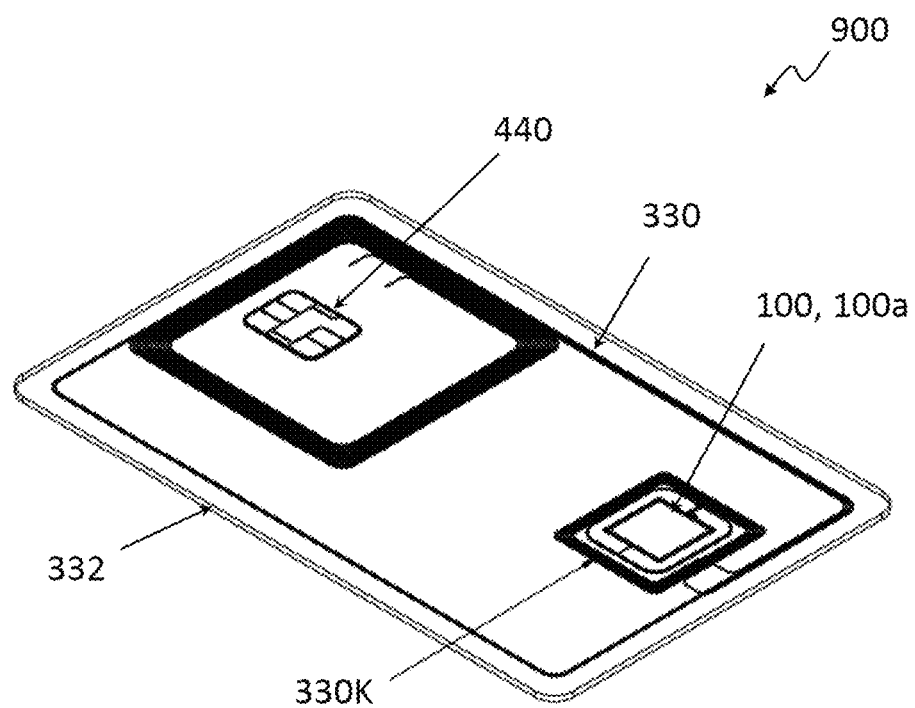

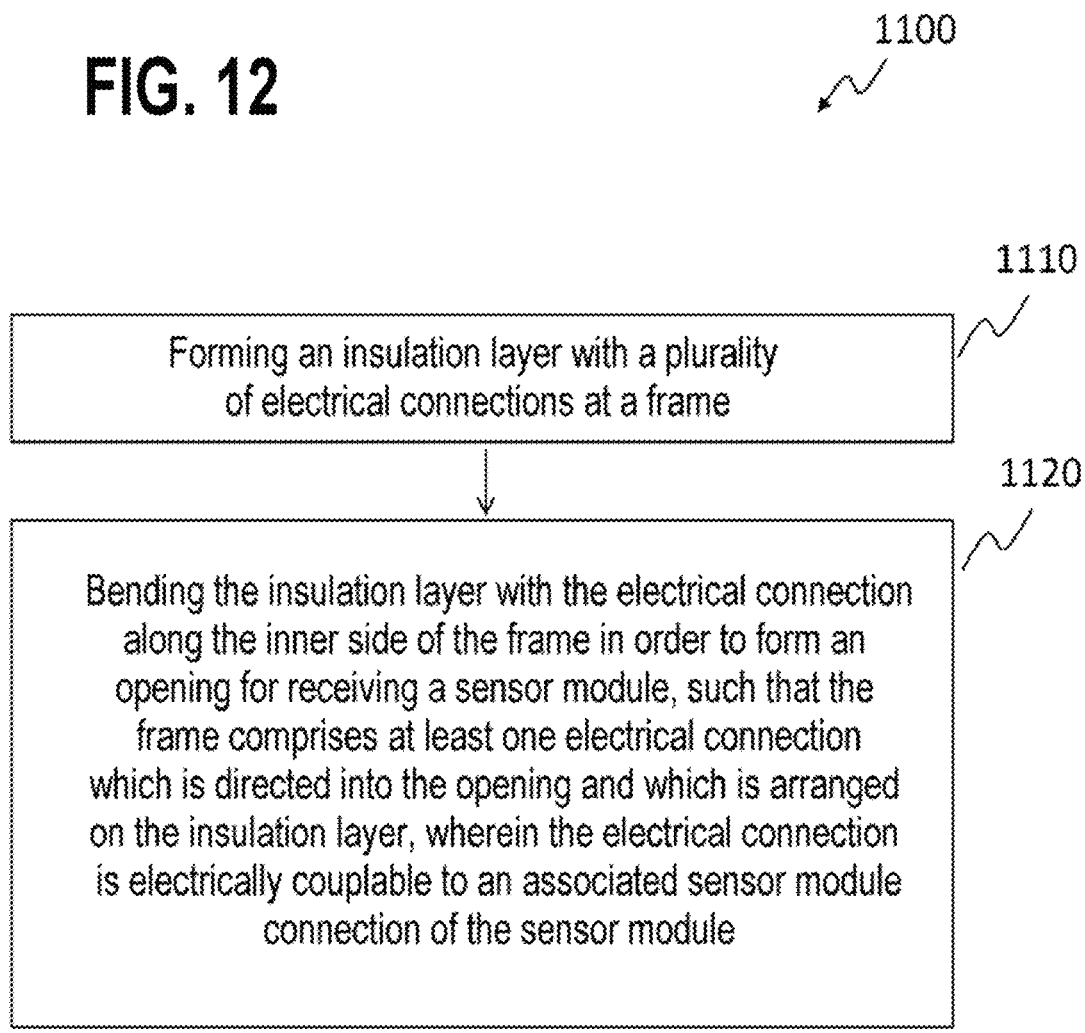

US 11,594,481 B2

PACKAGE, METHOD FOR FORMING A PACKAGE, CARRIER TAPE, CHIP CARD AND METHOD FOR FORMING A CARRIER TAPE

FIELD OF THE DISCLOSURE

The disclosure relates to a package, a method for forming a package, a carrier tape, a chip card and a method for forming a chip card.

BACKGROUND

Nowadays there is a clear trend toward chip cards or smartcards, e.g. for banking applications or access control, which are provided with biometric sensors for authentication, e.g. with fingerprint sensors.

However, these cards have a complex construction with a plurality of components electrically connected to one another. By way of example, the fingerprint sensor can be electrically conductively connected to a chip (which can provide security-relevant functions and is then also referred to as a secure element) and to an antenna.

PCB-substrate-based biometric fingerprint sensors are typically produced from PCB panels and singulated therefrom e.g. by means of stamping, milling or cutting. The chip modules are then present as individual modules, which does not constitute a standard form of provision for the production of a smartcard.

For wide acceptance, mass market applications, such as e.g. payment/banking applications, must firstly be cost-effective and secondly satisfy prescribed reliability and/or security requirements, e.g. comply with the demands of the CQM standard with regard to mechanical reliability.

Hitherto, PCB-substrate-based biometric fingerprint sensors for biometric smartcards have not yet been mass-produced goods, and so hitherto the requirement has not yet arisen to revise the production concepts in the direction of suitability for mass production.

For mass production, however, there is a need for production methods for PCB-substrate-based biometric fingerprint sensors which are suitable therefor. For this purpose, it might be useful to be able to use established mounting methods that are currently used, e.g. implanting modules and sensors with standard chip card implanting equipment, e.g. by means of a hotmelt implantation using standard delivery formats, for example a 35 mm chip card carrier tape.

Silicon-based sensor packages that are usually produced by means of encapsulated substrates are confronted with similar challenges.

Integration of sensor packages into a 35 mm chip card carrier tape is usually effected for example by a module being secured to the carrier tape by means of an epoxy-based adhesive and being connected by means of wire bond connections. However, such an arrangement can easily be damaged mechanically, even by means of mechanical loads such as bending, torsion or pressure that are typical of chip cards.

There is a need for a cost-effective, reliable and easy-to-mount biometric sensor (e.g. a fingerprint sensor) for integration into a chip card, e.g. into a so-called smartcard.

This need exists both for silicon-based biometric sensors described above and for printed-circuit-board-based (PCB-based) biometric sensors for chip cards.

SUMMARY

In various exemplary aspects of the disclosure, a package, e.g. a chip module with a fingerprint sensor, is provided which is implantable into a chip card body easily and in a manner suitable for mass production.

In various exemplary aspects, a package is provided in which an insulation layer with electrical connections is provided at a frame, said insulation layer being bent in such a way that it forms an opening for receiving a sensor module, the sensor module connections of which are couplable to the electrical connections in the opening. In various exemplary aspects, at least the insulation layer (in various exemplary aspects, optionally, furthermore an insulation layer of the frame) can be part of a standard 35 mm carrier tape for roll-to-roll production of chip modules.

In various exemplary aspects, the package can be assembled from a first component and a second component, which are easily couplable. In this case, the first component can comprise the fingerprint sensor and is accordingly also referred to as sensor module, and the second component can be the carrier having an opening, in which the first component is arranged, and is therefore also referred to as carrier component.

In various exemplary aspects, the carrier can be a standard 35 mm carrier tape for roll-to-roll production of chip modules. This can make it possible that the package (chip module) implantation into the chip card body can be effected on standard machines present, for example on the part of the end customer. During standard further processing, the package can be singulated, e.g. stamped out, from the carrier tape and be implanted into the chip card body, for example by means of a hotmelt process.

To put it another way, the standard 35 mm carrier tape constitutes the known form of provision for the chip modules and forms (e.g. after stamping out) a part of the package.

In various exemplary aspects, the package (also referred to as sensor module) can comprise the sensor, e.g. a biometric sensor, e.g. a fingerprint sensor, and an integrated (coupling) antenna or exposed connections, e.g. for connecting an antenna.

In various exemplary aspects, the package (sensor module) can be inserted into a chip card (e.g. a smartcard).

In various exemplary aspects, a package, e.g. having a fingerprint sensor, is provided which is cost-effective, reliable and able to be assembled easily (e.g. by means of standard equipment). In various exemplary aspects, the package can be integrated into a chip card, e.g. a smartcard. Since the integration into the card is also effected in a simple and cost-effective manner, the chip card in accordance with various exemplary aspects is likewise cost-effective.

BRIEF DESCRIPTION OF THE DRAWINGS

Exemplary aspects of the disclosure are illustrated in the figures and are explained in greater detail below.

In the figures:

FIG. 1 shows schematic perspective views of a front side and a rear side of a sensor module of a package in accordance with various exemplary aspects;

FIG. 2C shows schematic perspective views and enlarged details of a front side and a rear side of a carrier component of a package after a bending process in accordance with various exemplary aspects;

FIG. 3 shows schematic perspective views of a front side and a rear side of a carrier tape with a plurality of carrier components in accordance with various exemplary aspects;

FIG. 5 shows schematic perspective views of a front side and a rear side of a package in accordance with various exemplary aspects;

FIG. 6 shows a schematic plan view with a partial cross-sectional view of a package in accordance with various exemplary aspects;

FIG. 9 shows schematic perspective views of a chip card in accordance with various exemplary aspects;

FIG. 12 shows a flow diagram of a method for forming a package in accordance with various exemplary aspects.

DETAILED DESCRIPTION

In the following detailed description, reference is made to the accompanying drawings, which form part of this description and show for illustration purposes specific aspects in which the disclosure can be implemented. In this regard, direction terminology such as, for instance, "at the top", "at the bottom", "at the front", "at the back", "front", "rear", etc. is used with respect to the orientation of the figure(s) described. Since components of aspects can be positioned in a number of different orientations, the direction terminology serves for illustration and is not restrictive in any way whatsoever. It goes without saying that other aspects can be used and structural or logical changes can be made, without departing from the scope of protection of the present disclosure. It goes without saying that the features of the various exemplary aspects described herein can be combined with one another, unless specifically indicated otherwise. Therefore, the following detailed description should not be interpreted in a restrictive sense, and the scope of protection of the present disclosure is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, insofar as this is expedient.

In order to differentiate between exemplary aspects, some apparatuses, devices, components, etc., in addition to a generic reference sign, may also be provided with a reference sign which has the generic reference sign followed by a lower case letter.

Figure 2A:
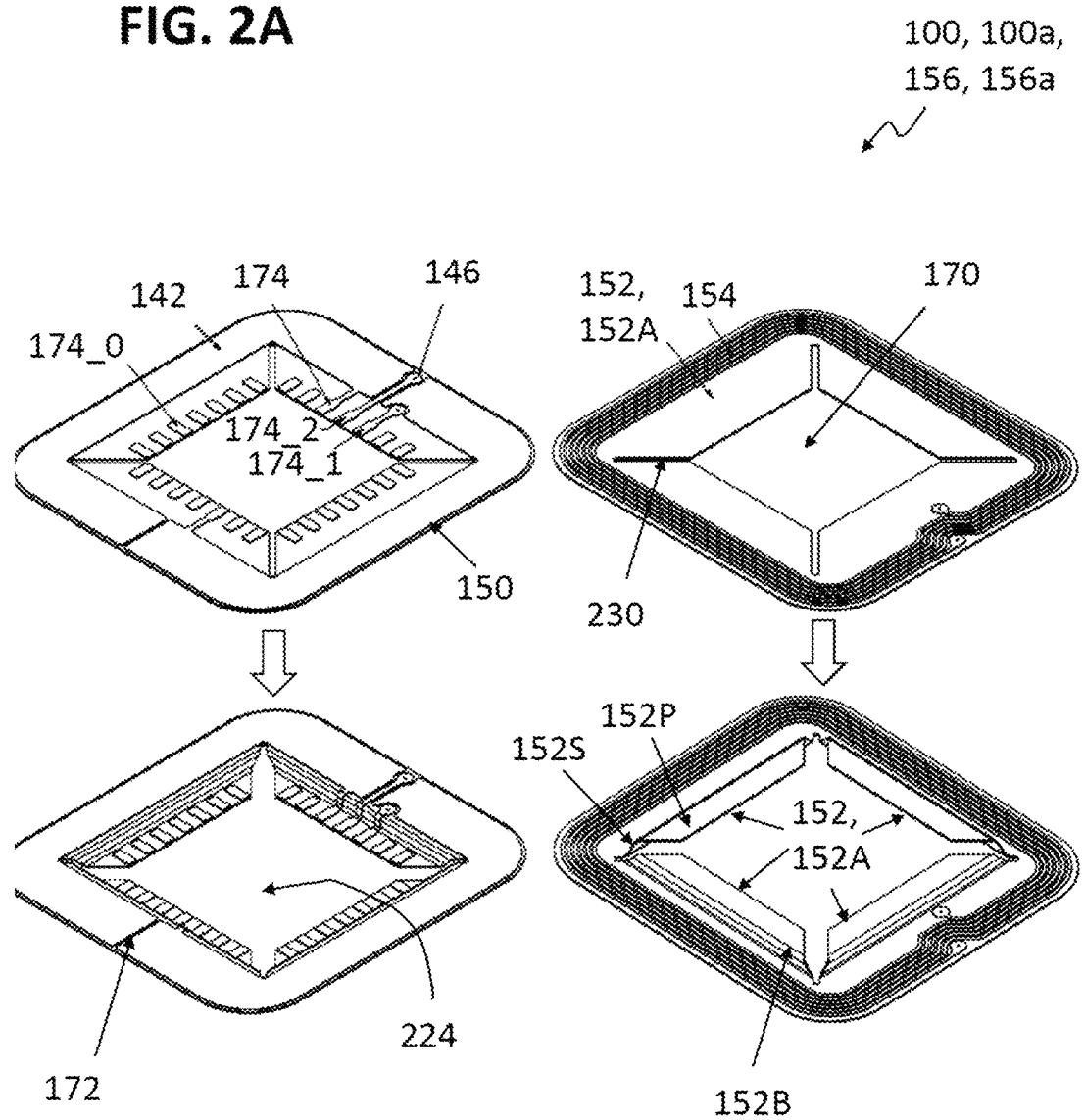
FIG. 2A shows schematic perspective views of a front side and a rear side of a carrier component of a package before and after a bending process in accordance with various exemplary aspects.
Figure 2B:
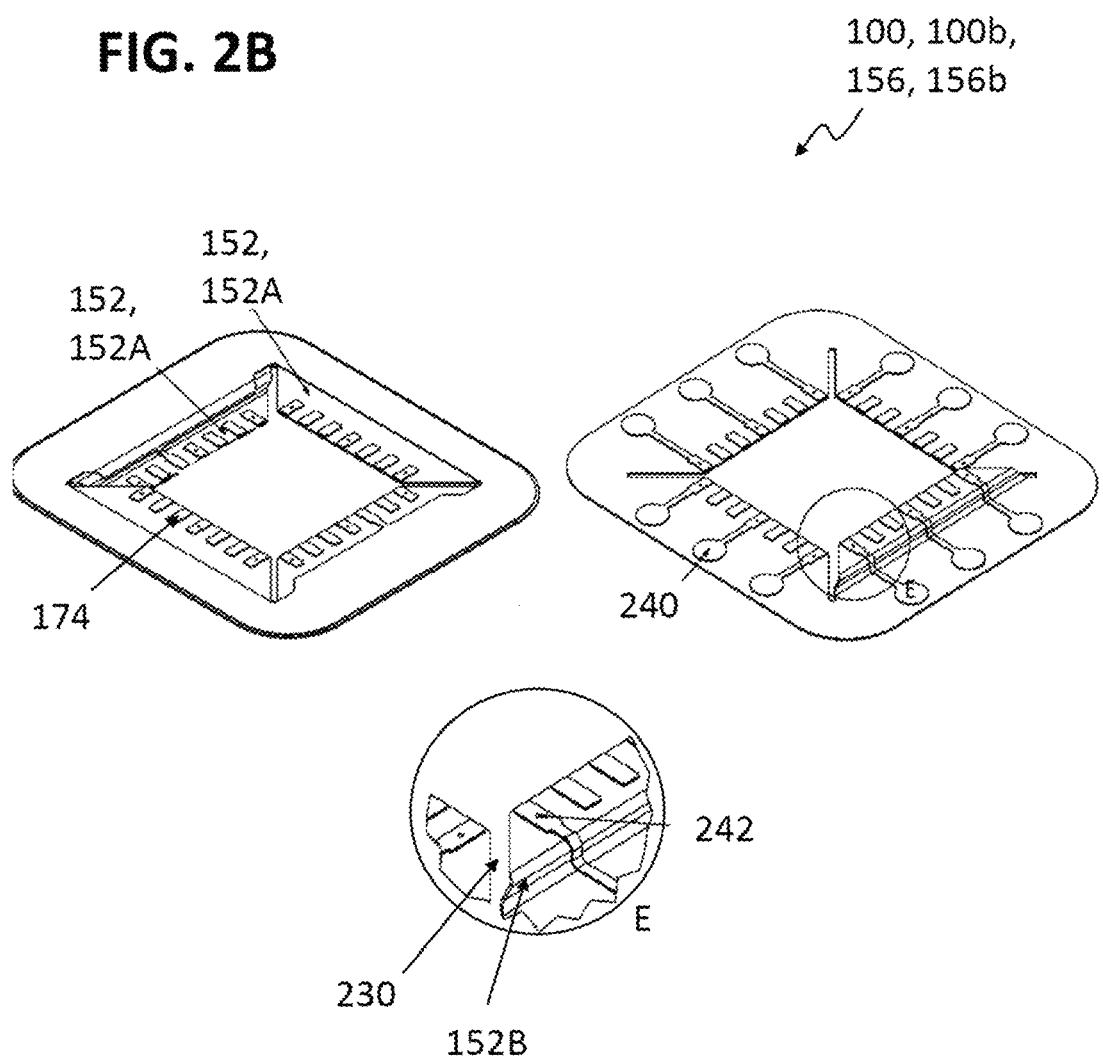
FIG. 2B shows schematic perspective views of a front side and a rear side of a carrier component of a package before and after a bending process in accordance with various exemplary aspects.

FIG. 1 shows perspective views of a front side and a rear side of a sensor module 101 of a package 100 in accordance with various exemplary aspects, FIG. 2A shows schematic perspective views of a front side and a rear side of a carrier component 156 of a package 100 before and after a bending process in accordance with various exemplary aspects, FIG. 2B shows schematic perspective views of a front side and a rear side of a carrier component 156 of a package 100 before and after a bending process (on the right, only one of four sections has already been bent) in accordance with various exemplary aspects, FIG. 2C shows schematic perspective views and enlarged details of a front side and a rear side of a carrier component 156 of a package 100 after a bending process in accordance with various exemplary aspects.

Figure 7A:
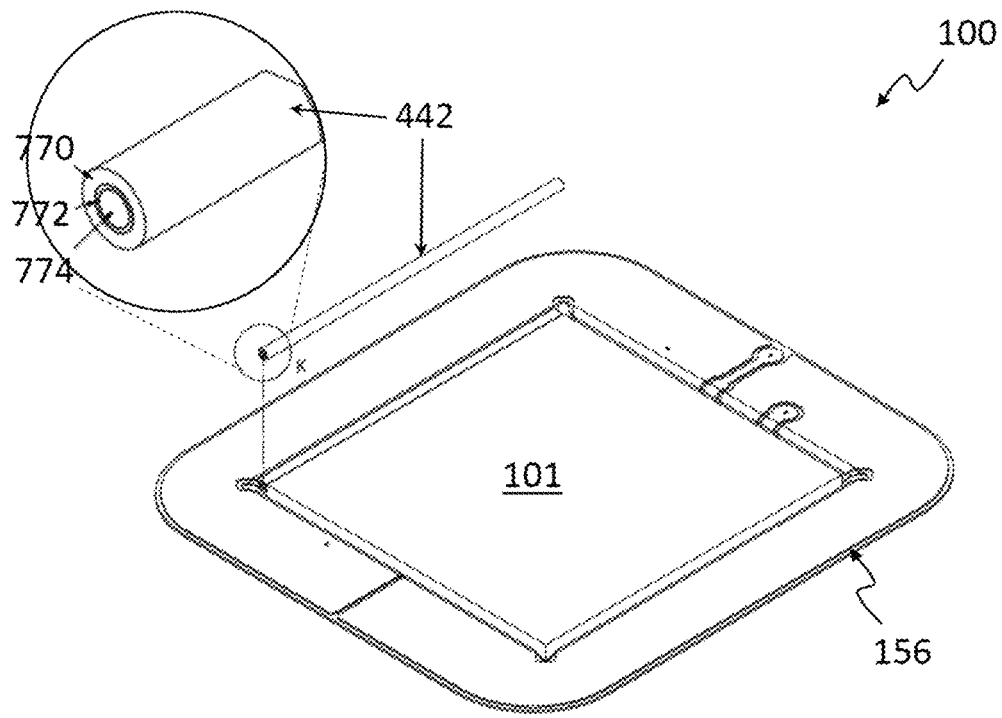
FIG. 7A shows a schematic perspective view and an enlarged detail of a front side of a package in accordance with various exemplary aspects during a sealing process.
Figure 7B:
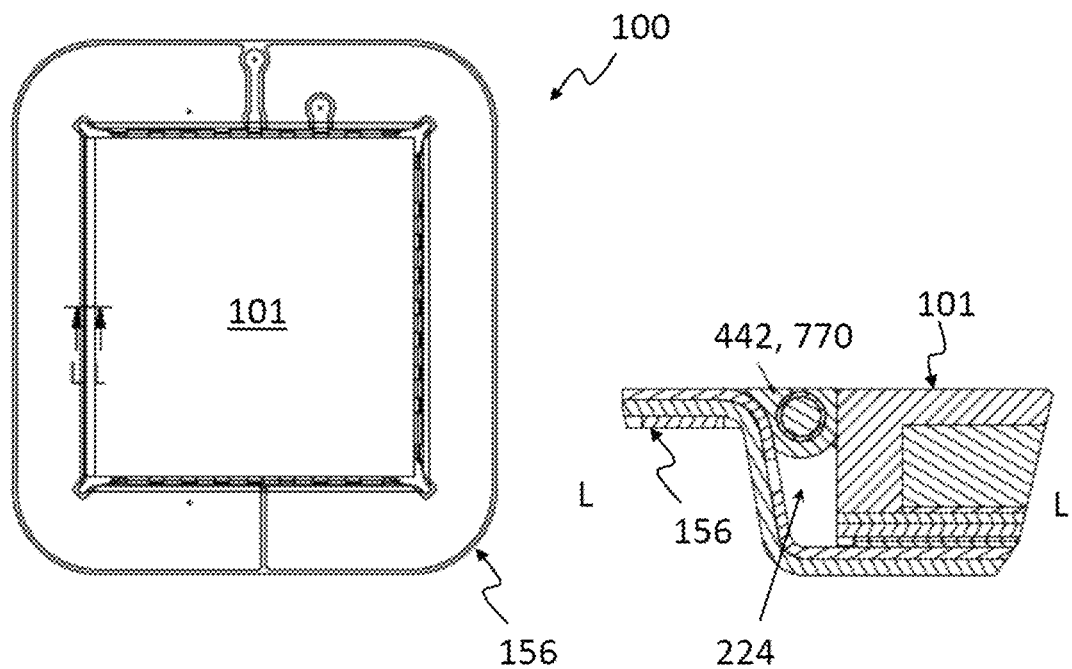
FIG. 7B shows a schematic plan view of the front side of the package from FIG. 7A and a partial cross-sectional view after sealing.
Figure 8:
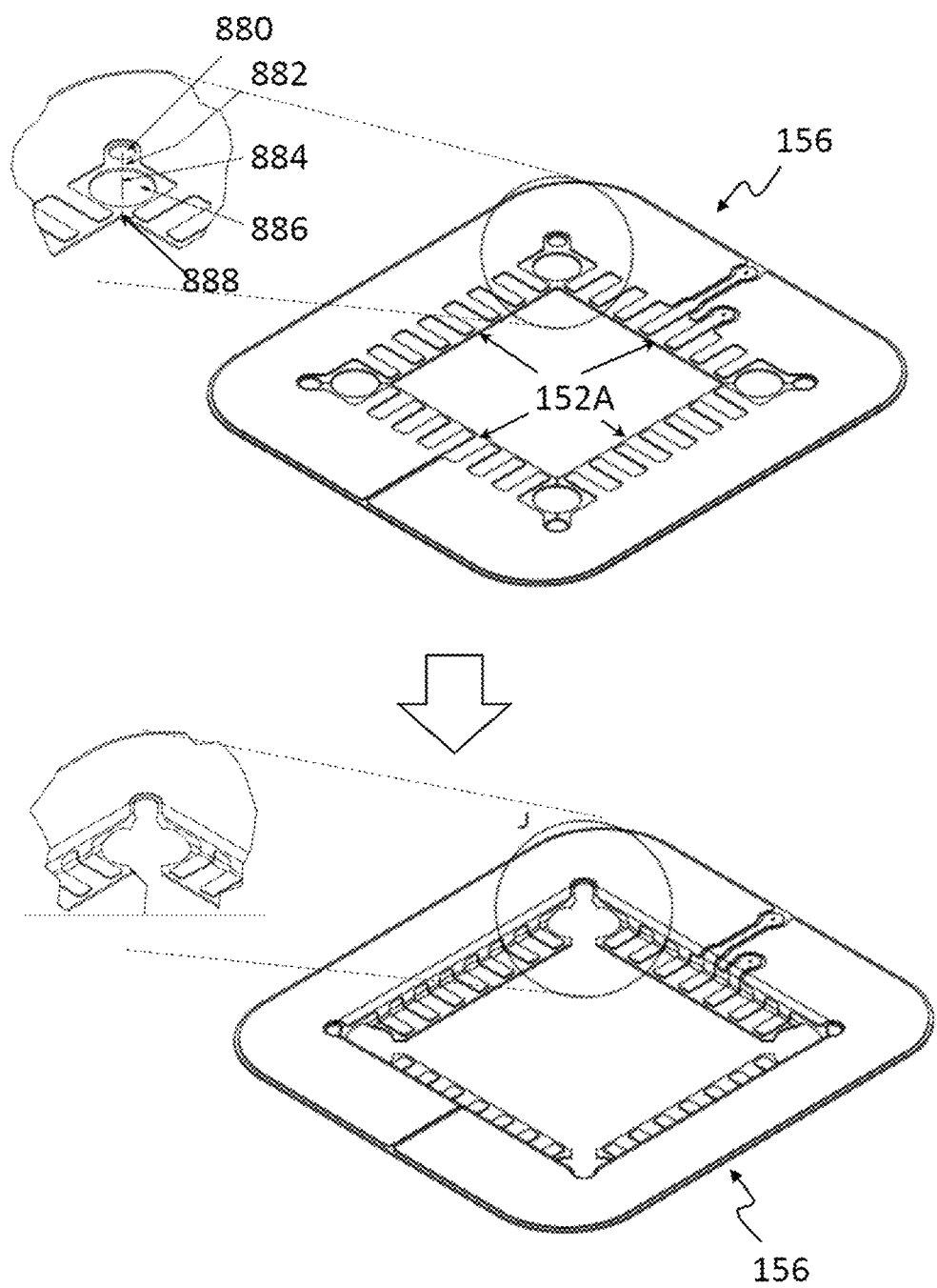
FIG. 8 shows schematic perspective views and enlarged details of a front side of a carrier component of a package before and after a bending process in accordance with various exemplary aspects.

FIG. 3 shows schematic perspective views of a front side and a rear side of a carrier tape 300 with a plurality of carrier components 156 in accordance with various exemplary aspects, FIGS. 4A to 4F show schematic perspective illustrations for elucidating a process for producing a package 100 in accordance with various exemplary aspects, FIG. 5 shows schematic perspective views of a front side and a rear side of a package 100 in accordance with various exemplary aspects, FIG. 6 shows a schematic plan view with a partial cross-sectional view of a package 100 in accordance with various exemplary aspects, FIG. 7A shows a schematic perspective view and an enlarged detail of a front side of a package 100 in accordance with various exemplary aspects during a sealing process, FIG. 7B shows a schematic plan view of the front side of the package 100 from FIG. 7A and a partial cross-sectional view after sealing, and FIG. 8 shows schematic perspective views and enlarged details of a front side of a carrier component of a package 100 before and after a bending process in accordance with various exemplary aspects.

The package 100 can comprise a biometric sensor 109 and can therefore also be referred to as a sensor device 100. The biometric sensor 109 can be a fingerprint sensor 109, for example. The fingerprint sensor 109 can comprise for example a silicon-based area sensor or a printed-circuit-board-based (PCB-based) biometric sensor having a sensor area 101S (for example for detecting fingerprints).

The fingerprint sensor 109 can be arranged on a top side of a printed circuit board (PCB) 105, which forms a substrate 105. The substrate 105 can be formed as a multi-layered substrate, for example having an upper metal layer, an (electrically insulating) substrate core and a lower metal layer. The substrate can optionally comprise an upper and a lower solder mask layer and further metal and insulating layers. To put it another way, the substrate, e.g. in the case of more complex PCBs, can be formed as a multi-layer substrate.

In various exemplary aspects, the sensor chip 109 can be electrically conductively connected to the upper metal layer of the substrate 105 by means of wire bonding (e.g. by means of a wire 158).

The sensor chip 109 can be encapsulated with a cap composed of encapsulation material 102, for example an epoxy-based potting compound.

A flat surface of the encapsulation material 102 can form a sensor region, which is touched by a user's finger for the purpose of fingerprint detection.

The sensor region of the encapsulation material 102 can accordingly be exposed, such that the fingerprint sensor 109 is able to be touched by a finger and is configured to detect fingerprint features of the finger.

If on the top side of the substrate 105 there is still free space available in the encapsulated region, further components, for example a sensor evaluation chip 110 and/or further circuit elements 130 (which can also comprise a second chip, for example), can be arranged on the top side of the substrate 105. Otherwise, the second chip 130 and/or the circuit elements 130 can be arranged on the underside of the substrate 105. This is illustrated by way of example in FIG. 1A (at the bottom).

The sensor evaluation chip 110 and optionally further chips can be applied by means of flip-chip mounting (FC mounting) (for example soldered as a so-called "Surface Mounted Device" SMD, adhesively bonded, etc.).

However, other or further connection technologies such as wire bonding can likewise be used. The additional circuit elements 110, 130 can comprise for example a security chip (also referred to as a secure element (SE)) 110, a microcontroller unit (MCU), an energy source (e.g. a voltage supply that provides energy that is received by means of a booster antenna from an electromagnetic field generated by an external reader) and/or additional active and/or passive components that facilitate or enable for example a function of the fingerprint sensor 101.

The sensor module 101 can comprise sensor module connections 103, at least one portion of which can be electrically conductively connected to the sensor 109, the chip 110 and/or the further circuit components 130. In various exemplary aspects, the sensor module connections 103 can be arranged on a side (the underside) of the sensor module 101 facing away from the sensor area 101S. The two or more sensor module connections 103 can be arranged along a periphery of the sensor module 101. That is illustrated at the bottom in FIG. 1, where an underside of the sensor module 101 is shown.

Main surfaces of the sensor module 101 can be shaped as a polygon, for example as a quadrilateral (e.g. a square or rectangle), as a pentagon, a hexagon, etc.

The sensor module connections 103 can be arranged along one of the sides of the polygon, along two sides, which can be situated opposite one another, for example, along three sides, along four or more, e.g. all, sides.

In various exemplary aspects, two or more of the sensor module connections 103 can be configured to transfer (to receive or to transmit) the same signal, i.e. as redundant sensor module connections 103.

The sensor module connections 103 can furthermore be configured to be brought into electrically conductive contact with electrical connections 174 of the carrier component 156.

In various exemplary aspects, a portion of the sensor module connections 103 can be arranged in electrically insulating fashion from the sensor 109 and, if present, from the chip 110 and the further circuit components 130. These non-connected sensor module connections 103 can serve for mechanically securing the sensor module 101 to the carrier component 156 and can be mechanically coupled for example to likewise unconnected connections 174_0 that are formed jointly with the electrical connections 174.

FIG. 2A shows a singulated carrier component 156, 156*a* (see for comparison FIG. 3 and the associated description, in which the unsingulated carrier component 156 is part of a carrier tape 300).

The carrier component 156 can comprise a frame 150 (the frame is highlighted in a dotted manner in FIG. 4A) having a (for example pocket- or box-shaped) opening 224 for receiving a sensor module 101 (in the cross-sectional view in FIG. 7B the opening 224 can be discerned better than in the perspective views).

The frame 150 can comprise a plurality of electrical connections 174 which are directed to the opening 224 and which can be arranged on an insulation layer 152 applied to the frame 150.

At least one electrical connection 174 of the electrical connections 174 can be electrically couplable to an associated sensor module connection 103 of the sensor module 101.

The insulation layer 152 can be connected to the frame 150 at an insertion side of the frame 150, from which side the sensor module 101 is to be inserted into the opening 224, and is bent along the width of the frame 150 proceeding from the insertion side, such that the at least one electrical connection 174 is couplable to the associated sensor module connection 103 in an arrangement in which the sensor module connection 103 faces the at least one electrical connection 174.

To put it another way, the insulation layer 152 can be applied to the frame 150, the electrical connections 174 being formed on said insulation layer, and the insulation layer 152 can be bent together with the electrical connections 174 so as to form the opening 224 for receiving and electrically contacting the sensor module 101. For the purpose of electrical contacting, the electrical connections 174 can be arranged on the insulation layer 152 such that during the process of arranging the sensor module 101 in the opening 224 at least one of the electrical connections 174 lies over an assigned one of the sensor module connections 103, and so an electrically conductive contact is producible directly (see e.g. the cross-sectional view from FIG. 6) or indirectly by means of a contact medium, e.g. a solder, an electrically conductive adhesive or the like.

In various exemplary aspects, the insulation layer 152 can comprise a through opening 170 and a plurality of slots 230 extending from the through opening 170 in the direction toward the frame 224 (see the exemplary aspects in FIG. 2A and FIG. 2B), or a plurality of slots 230 extending from a central region of the insulation layer 152 in the direction toward the frame 150.

In various exemplary aspects, predetermined breaking lines 884 can be provided instead of the slots 230. That is illustrated by way of example in FIG. 8, where circular through openings 880, 886 are arranged such that during a process of bending the sections 152A the insulation layer 152 tears along the predetermined breaking lines 884 (e.g. at the locations 882, 888) because an elasticity limit of the insulation layer 152 is exceeded there.

The slots 230 or the predetermined breaking lines 884 can be formed such that a connecting line of end points—near the frame—of two adjacent slots 230 or predetermined breaking lines 884 runs straight and substantially parallel to an outer or inner edge of the frame.

Instead of removal of material as separation of the sections 152A from one another the slots 230 can also be formed by chipless strip steel cutting. That is to say that instead of material being stamped out (slot 230 having a predefined width), the material is only severed in a chipless manner. This has the advantage that the separating region can be kept very narrow, i.e. as slot 230 having a width of or close to zero.

Producing predetermined breaking lines 884 can be advantageous firstly to the effect that only relatively coarse stamping tools having predefined shapes (circles, rectangles) are needed for production, secondly to the effect that until the bending process, which can be effected for example directly before the process of arranging the sensor module 101, the carrier component 156 (for example the carrier tape body 320) is flat, and so it is possible to avoid damage during handling or transport of the (e.g. already stamped and coated) carrier tape body 320.

Two adjacent slots 230 or predetermined breaking lines 884 can produce an insulation layer section (for short: section) 152A as part of the insulation layer 152, which section can be bendable in order to form the opening 224.

The section 152A can comprise after bending at the frame 150 a perpendicular part 152S extending substantially perpendicular to the frame 150, and at the perpendicular part a parallel part 152P extending substantially parallel to the frame 150. In this respect, see the exemplary design in FIG. 2A.

In various exemplary aspects, a single section 152A can be provided, which provides the electrical connections 174. In various exemplary aspects, a plurality of sections 152A can be provided, for example at least two sections 152A situated opposite one another, or three or more sections 152A. In that case the sections 152A can additionally serve as a mount or support for the sensor module 101.

The opening 224 can have an area that forms a polygon. By way of example, a shape of the opening 224 can be formed in a manner corresponding to a shape of the sensor module 101 that is to be received or is received. A height (H) of the perpendicular part 152S can correspond to a thickness of the sensor module 101, such that the sensor module 101 is arrangeable or arranged flush with the frame in the opening 224 and satisfies the flatness requirements of ISO and CQM standards.

In various exemplary aspects, one of the sections 152A can be arranged at each side of the polygon.

In various exemplary aspects, the package 101 can be designed as a Coil-on-Module package 100a. A corresponding carrier component 156a with an integrated module antenna 154 configured for coupling to a booster antenna 330 (see FIG. 9) is illustrated by way of example in FIG. 2A, FIG. 2C and FIG. 5. The module antenna 154 can be arranged on the frame 150 and can be coupled to the electrical connections 174. The antenna connections are identified as 174_1 and 174_2 in FIG. 2A.

In various exemplary aspects, the package 100 can be designed as a contact-based package 100b. A corresponding carrier component 156b with contact pads 240 configured for electrically conductive connection to an antenna external to the package 101, e.g. an antenna of a chip card (and optionally to further electrical contacts) is illustrated by way of example in FIG. 2B. The contact pads 240 can be arranged on the frame 150 and can be coupled to the electrical connections 174. The contact pads 240 can be arranged on that side of the frame 150 into which extends the opening 224 (or that part of the insulation layer 152 which forms or surrounds the opening 224), i.e. on an underside of the package 100b.

In contrast to deep-drawing that is usually used, the opening 224 can be formed from the insulation layer 152 by means of bending.

Accordingly, the insulation layer 152 and the electrical connections 174 formed thereon can be bendable.

By way of example, a material and a layer thickness of the insulation layer 152 can be configured such that the bent region 152B of the section 152A has a neutral axis that is or was neither lengthened nor shortened during bending.

The insulation layer 152 can comprise for example a polymer, for example polyimide, PET or a reinforced epoxy material, for example having a thickness in the range of approximately 12 μm to approximately 50 μm or of approximately 20 μm to approximately 100 μm.

A material and/or a layer thickness of the electrical connections 174 can be chosen such that the electrical connections 174 remain electrically conductive in the bent region, in particular in a case where the electrical connections 174 run along an outer radius of the bend.

Radii in the bending region can be formed as small as possible in order to enable the smallest possible distance between an outer side surface of the sensor module 101 and an inner side surface of the opening 224. However, the radii should be large enough that neither the insulation layer 152 nor the electrical connections 174 break or tear. Accordingly, in various exemplary aspects, a minimum inner radius in the bending region 152B (see e.g. FIG. 2B) can comprise for example approximately 30 μm, for example at least 50 μm. A minimum outer radius can be correspondingly larger according to a material thickness. The minimum outer radius can be defined by a length extent with maximum tolerance of the electrical connections 174.

Figure 11A:
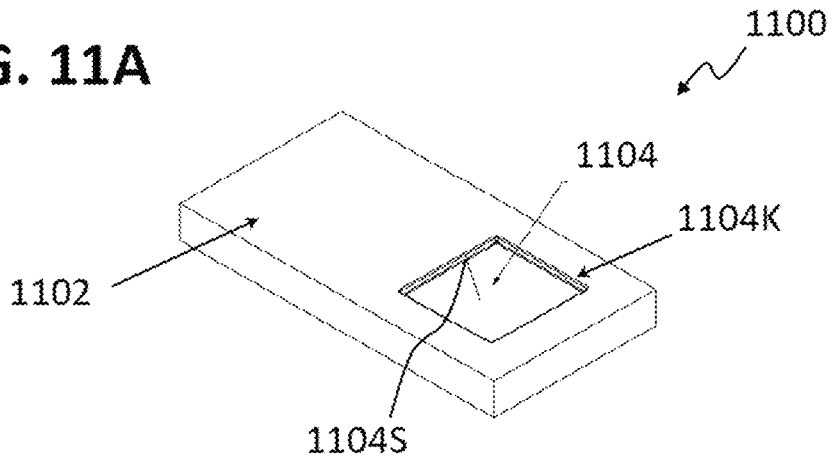
FIG. 11A shows a schematic perspective illustration of a tool for bending a carrier component of a package in accordance with various exemplary aspects.
Figure 11B:
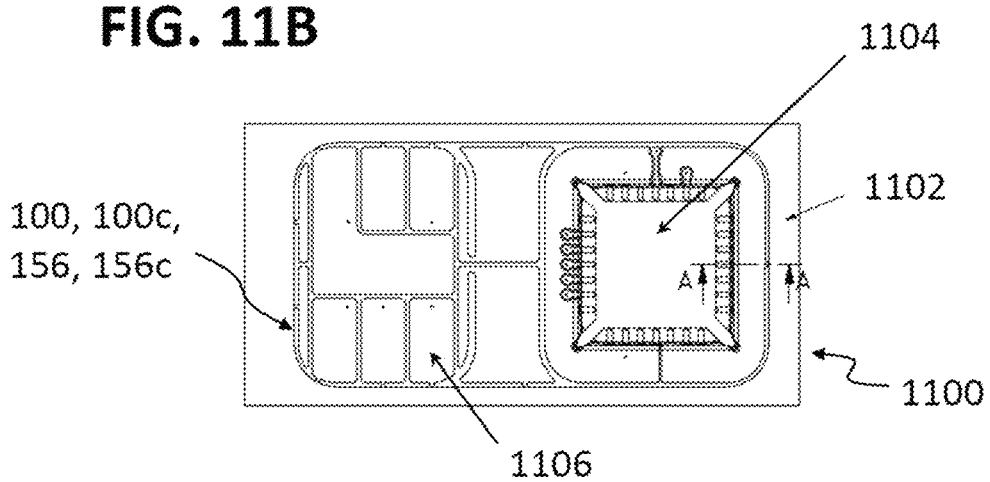
FIG. 11B shows a schematic plan view of the tool from FIG. 11A and the carrier component after a bending process.
Figure 11C:
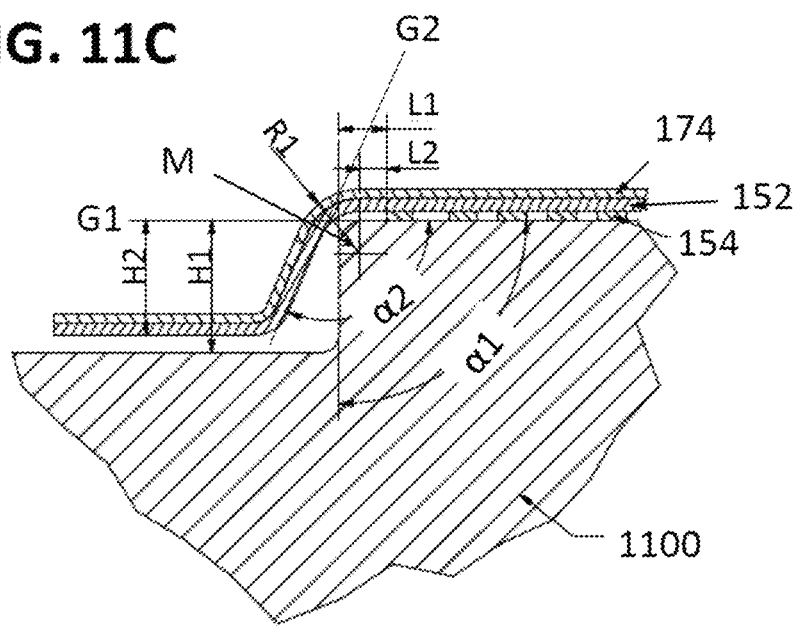
FIG. 11C shows a schematic cross-sectional partial view of the tool with the carrier component from FIG. 11B.

FIGS. 11A to 11C illustrate exemplary aspects which facilitate or enable bending of the insulation layer 152 with the electrical connections 174. In this case, FIG. 11A shows a schematic perspective illustration of a tool 1100 for bending a carrier component 156, 156c of a package 100, 100c in accordance with various exemplary aspects, FIG. 11B shows a schematic plan view of the tool 1100 from FIG. 11A and the carrier component 156, 156c after a bending process, and FIG. 11C shows a schematic cross-sectional partial view of the tool 1100 with the carrier component 156, 156c from FIG. 11B.

The exemplary tool 1100 illustrated in FIG. 11A comprises a single depression 1104 formed in a tool body 1102 for the purpose of forming the receiving opening 224. The depression has side surfaces 1104S and, at the transition to the upper main surface of the tool body 1102, an edge 1104K. The edge 1104K can be broken, e.g. with a chamfer or a rounding with a small radius, e.g. to 20 μm, or can be formed in sharp-edged fashion. In order to form the depression, the carrier component 156 can be arranged on or over the tool 1100 in a suitable position, and an appropriately matching stamp can be used to bend the insulation layer 152 into the depression 1104.

In various exemplary aspects, in order to form a plurality of receiving openings 224, for example in a carrier tape 300, as illustrated in FIG. 3, the tool 1100 can be formed with a plurality of depressions 1104.

In the carrier component 156, 156c illustrated in the plan view in FIG. 11B, the receiving opening 224 and contact segments 1106 of a contact-based chip module 440 are formed integrally, in order to form a so-called "ISO sensor module". The following explanations concerning aspects for bending the insulation layer are likewise applicable to the carrier components 156 described generally above, or to the exemplary aspects of the carrier components 156a, 156b. The line A-A illustrates which part of FIG. 11B is shown in the cross-sectional view from FIG. 11C.

FIG. 11C illustrates geometric conditions which are useful or, for example in the case of some materials of the electrical connections 174, possibly even necessary in order to enable or carry out crack-free bending of the carrier component 156.

The electrical connections 174 can comprise copper (Cu), for example, which can be coated (e.g. as a surface finish) for example with nickel (Ni), gold (Au), palladium (Pd) or for example a CuSnZn alloy (e.g. MIRALLOY®) or other alloys thereof, for example with a layer stack comprising nickel and gold, nickel and palladium or nickel and the CuSnZn alloy. A thickness of the electrical connections 174 can be for example in the range of approximately 10 µm to approximately 50 µm.

The insulation layer 152 can for example be formed from polyimide or comprise polyimide, and have for example a thickness in the range of approximately 12 µm to approximately 50 µm.

The carrier component 156, 156c, in a similar manner to the carrier components 156a, 156b can comprise on the top side a contact region 142, and optionally, as described above, the contact segments 1106.

In various exemplary aspects, the electrical connections 174, the contact region 142 and optionally the contact segments 1106 can be formed from the same material, by means of a joint process or by means of different processes.

On the underside, the carrier component 156, 156c can be designed as a contactless carrier component similar to the carrier component 156a and can be equipped with an antenna 154, shown in FIG. 11C. Alternatively, the carrier component 156, 156c can be designed as a contact-based carrier component similar to the carrier component 156, 156b and can be equipped with contact pads 240 on the underside. If necessary, it is possible to form through contacts (vias) 242 through the insulation layer 152.

If an electrically conductive structure on the top side comprises a relatively brittle material, cracks can possibly occur e.g. above the edge 1104K of the tool 1100, where for example the contact region 142 can be formed. The cracks can for example concern only the surface finish (e.g. a nickel-gold double layer), with the result that the underlying metal layer (e.g. copper layer) is exposed, or else also extend through the underlying metal layer, which can lead to the problems already explained above.

In various exemplary aspects, it is possible to design the metal layer 154, 240 (in particular in the region to be bent) on the underside of the carrier component 156, 156c, which is in contact with the tool 1100, in such a way, in particular with regard to its spatial arrangement, that crack-free bending of the carrier component 156, 156c is made possible or simplified.

In various exemplary aspects, a region over the edge 1104K can be free of layer(s) of electrically conductive material, e.g. metal, e.g. from the antenna 154 or the contact pads 240.

During the bending process, the stamp can press the carrier component 156, 156c into the depression 1104 of the tool 1100 in such a way that the underside of the carrier component 156, 156c bears against or substantially bears against areas of the tool 1100.

To put it another way, while the stamp exerts force on the carrier component 156, 156c, the shape of the carrier component 156, 156 can copy the shape of the tool 1100, in particular with regard to an angle α2 between a region of the carrier component 156, 156c facing the side surface 1104S of the tool 1100 and a region of the carrier component 156, 156c facing a main surface of the tool 1100, from which main surface the depression 1104 extends into the tool body 1102. The angle α2 can then correspond to the angle α1—predefined by the tool 1100—between the side surface 1104S and the main surface, for example 90°. A height H2 of the carrier component region that forms the receiving region 224 can correspond to a depth H1 of the depression 1104.

After the stamp has been removed, the carrier component 156, 156c owing to elastic properties of the materials forming the carrier component 156, 156c, can spring back at least somewhat in the direction of its original shape.

After the springing back, the angle α2 can increase, for example become greater than 90°, and the height H2 decreases.

The carrier component 156, 156c can be bent in the region over the edge 1104 and in adjacent regions. In cross section (such as e.g. in FIG. 11C), the bend can be formed (at least approximately) as a segment of a circle having a radius R1 and a center point lying within the tool 1100. If the radius is not constant along the bend, but rather increases for example toward marginal regions of the bend, R1 refers to the smallest (usually central) radius.

Empirical experiments have revealed that the cracks outlined above are effectively prevented or the arising of said cracks is at least made more difficult if the underside of the carrier component 156, 156c within a region defined below is free of layer(s) of electrically conductive material (e.g. of the antenna 154 or the contact pads 240).

The region, during a positioning of the carrier component 156, 156c on the tool 1100 in such a way that a center point of the carrier component region 156, 156c which will form the receiving opening 224 and a center point of the depression 1104 are positioned one vertically above the other, can extend from a center point of the carrier component region 156, 156c beyond a vertical extension of the edge 1104K as far as a distance L1 from the vertical extension of the edge 1104K, wherein the distance L1 is in a range of approximately 50 µm to approximately 300 µm.

To put it another way, in various exemplary aspects, the layer(s) of electrically conductive material on the underside of the carrier component 156, 156c (e.g. the antenna 154 or the contact pads 240), during the positioning of the carrier component 156, 156c over the tool 1100 as outlined above, can be formed such that they do not extend closer to the vertical extension of the edge 1104K than L1, wherein L1 is in the range of between approximately 50 µm and approximately 300 µm.

A description of the region in which layer(s) of electrically conductive material 154, 240 can be formed at the carrier component 156, 156c, without adversely affecting the bending, can be described without recourse to the tool 1100 at least on the basis of the bent carrier component 156, 156c as follows: on an underside of the carrier component 156, 156c, the electrically conductive material 154, 240 can be formed only in a region which extends from an outer edge of the carrier component 156, 156c as far as a distance L1 from an intersection line formed by a plane running along the underside of the carrier component 156, 156c outside the part of the carrier component 156, 156c surrounding the opening 224 (said carrier component protruding convexly from the area in order to form the opening 224 in its interior) and a lateral surface of the part of the carrier component 156, 156c surrounding the opening. In FIG. 11C, that is illustrated on the basis of the cross section by means of the straight lines G1 and G2, wherein G1 corresponds to the cross section through the plane, and G2 corresponds to the cross section through the lateral surface.

In various exemplary aspects, L1 can be defined taking account of the radius R1.

R1 can be influenced or determined for example by respective thicknesses of the insulation layer 152 and of the metal layer 174 and elasticities of the materials forming them.

L1 can be chosen such that a vertical line leading through the center point of the radius R1 is at a distance L2 (where L2>0) from the closest metal structure (e.g. from the antenna 154 or from contact pads 240) on the underside of the carrier component 156, 156c.

To put it another way, in various exemplary aspects, the vertical line leading through the center point of the radius R1 can be closer by L2 to the edge 1104K than the metal structure closest to the edge 1104K (e.g. the antenna 154 or the contact pads 240) on the underside of the carrier component 156, 156c.

In an illustrative description, thicker, more elastic layers 152, 174 can have the effect that the radius R1 increases and the center point M thus moves away further from the edge 1104K, as a result of which a larger distance L1 (for example a distance closer to the 300 µm than to the 50 µm) can become necessary.

In various exemplary aspects, the electrical connections 174 can be plastically deformable. To put it another way, the electrical connections 174 can be deformed during bending such that they remain in their bent shape after bending. After bending, the electrical connections 174 can be so dimensionally stable that they additionally prevent the insulation layer 152 from elastically springing back. To put it another way, without the metal coating (the electrical connections 174) on inner and outer radii the insulation layer could spring back at least approximately to its original shape.

FIG. 4A to FIG. 4F illustrate a method for producing a package 100 on the basis of the example of an individual package 100, even if, as explained in association with FIG. 3, the process is advantageously implementable at the carrier tape level.

Firstly, a flat carrier tape component 156 can be formed. A process such as is used for the production of chip card tapes can typically be used. By way of example, an insulation layer 152 can be structured by (for example by means of stamping, etching, (laser) cutting or other known structuring processes) the gaps 230 and the through opening 170 being formed for the purpose of forming the sections 152A. On the insulation layer 152, a metal layer for forming at least the electrical connections 174 can be arranged and structured, e.g. by means of an etching process, or the metal layer can be applied in already structured form. The result is illustrated by way of example in FIG. 4A.

The sections 152 can thereupon be bent in order to form the receiving opening 224. That is illustrated by way of example in FIG. 4B.

Figure 4A:
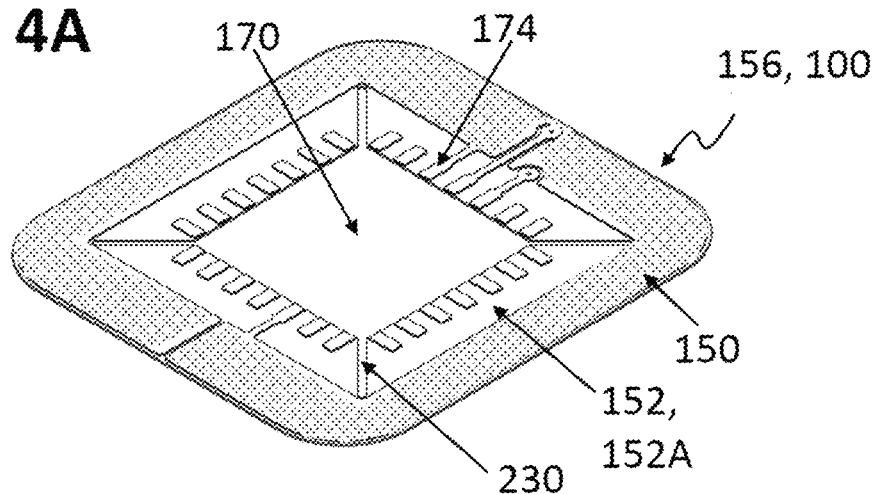
FIGS. 4A to 4F show schematic perspective illustrations for elucidating a process for producing a package in accordance with various exemplary aspects.
Figure 4B:
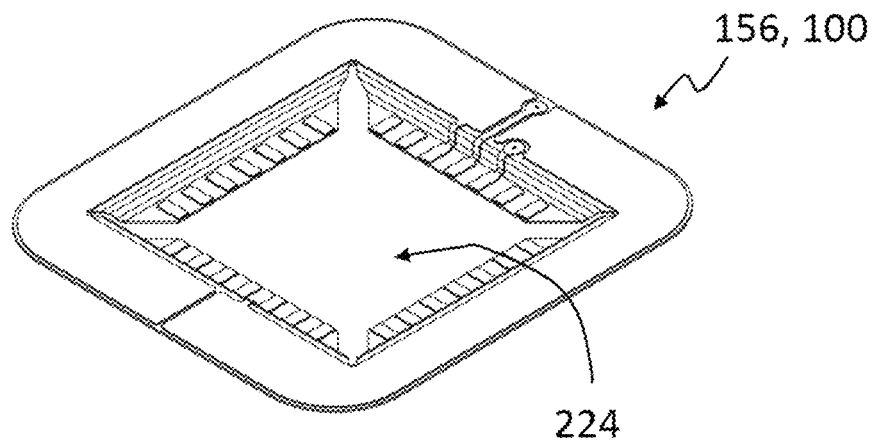
Figure 4C:
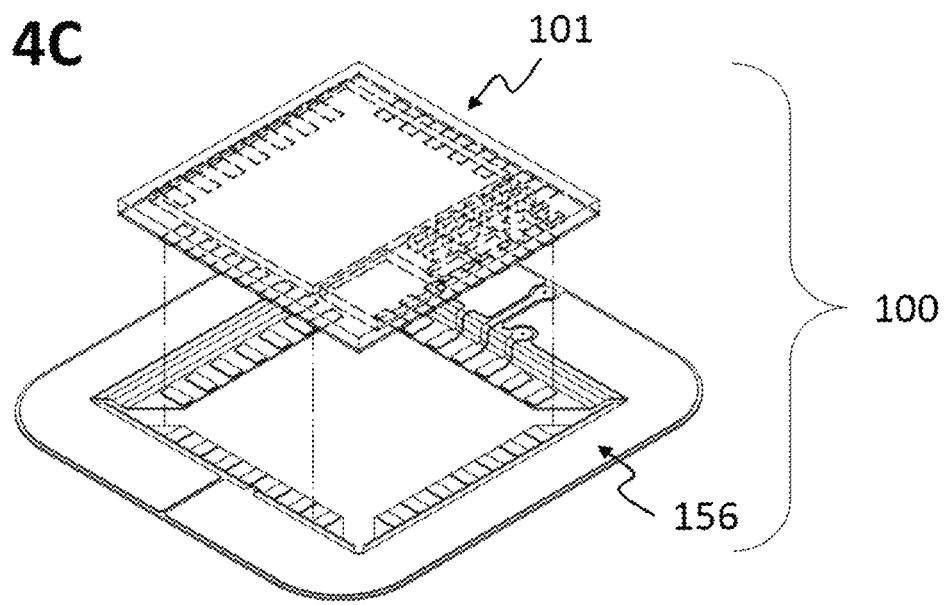
Figure 4D:
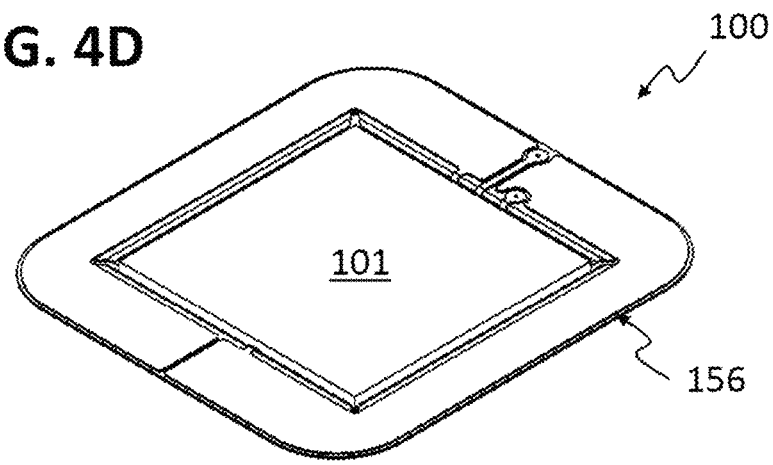

Afterward, the sensor module 101 can be connected to the carrier component 156. The sensor module 101 can be introduced into the opening 224 and be mechanically coupled and electrically conductively coupled to the carrier component 156. That is illustrated by way of example in FIG. 4C; the resultant package is illustrated in FIG. 4D.

During connecting, the electrically conductive connections 174 are brought into (electrically conductive) contact with the sensor module connections 103.

Mounting the sensor module 101 on the carrier component 156 (that is to say e.g. on the carrier tape 300) can be effected in one of a number of ways, a number of which are described by way of example below.

The sensor module 101 can be mounted on the carrier component 156 by means of a nonconductive adhesive. The adhesive can be applied prior to mounting on the carrier component, the sensor module 101 or both, for example on respective purely mechanical securing regions.

In order to ensure a good electrically conductive contact between the electrically conductive connections 174 and the sensor module connections 103, an electrically conductive adhesive, for example a fully conductive adhesive or an anisotropic conductive adhesive (ACP), can additionally be applied in each case between the pairs contacting one another.

In various exemplary aspects, curing the adhesive (or both adhesives) can be effected in situ, for example as a so-called snap-cure process while the two components 101, 156 are pressed onto one another in a laminating apparatus. Alternatively, the curing can be effected in a box furnace or in a continuous reflow furnace, for example. As a further alternative, partial curing can be effected in a laminating apparatus in order that the sensor module 101 and the carrier component 156 can be fixed relative to one another. Complete crosslinking of the adhesive can then be effected in a box furnace or a continuous reflow furnace.

In a departure from the adhesive bonding method described above, the sensor module 101 can be mounted on the carrier component 156 by means of a conductive adhesive (fully conductive adhesive or an anisotropic conductive adhesive).

The adhesive can be applied prior to mounting on the carrier component, the sensor module 101 or both, for example on purely mechanical securing regions and between electrically conductive connection/sensor module connection pairs for an electrically conductive connection.

What may be advantageous here is that only one type of adhesive is used for mechanically and electrically connecting the components 101, 156.

The sensor module 101 can be mounted on the carrier component 156 by means of a soldering process. Respective contact regions of the components 101, 156 can be designed as a solderable surface. A flux can optionally be used in order to improve the soldered connection. One or both components can also be provided with a solder applied beforehand.

What may be advantageous here is that only one type of material is used for securing and for electrically conductively connecting the components 101, 156.

The soldering can be carried out in situ, for example in a soldering laminating apparatus. Alternatively, the soldering can be carried out in a reflow furnace, although that may have the disadvantage that other soldered connections of the package may also be melted again.

In various exemplary aspects, the processes described above can be combined with one another. By way of example, an adhesive for fitting the sensor module 101 to the carrier component 156 can be combined with soldering for the purpose of electrically conductive connection.

Figure 4E:
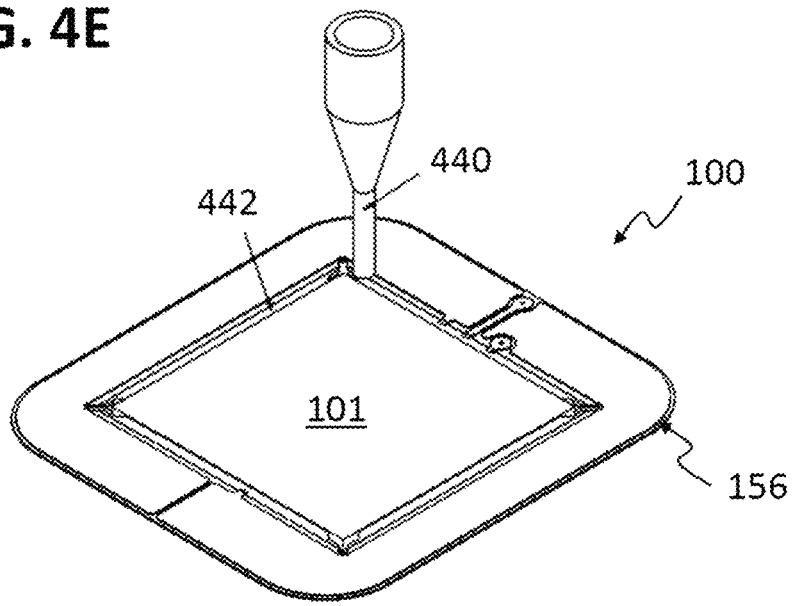
Figure 4F:
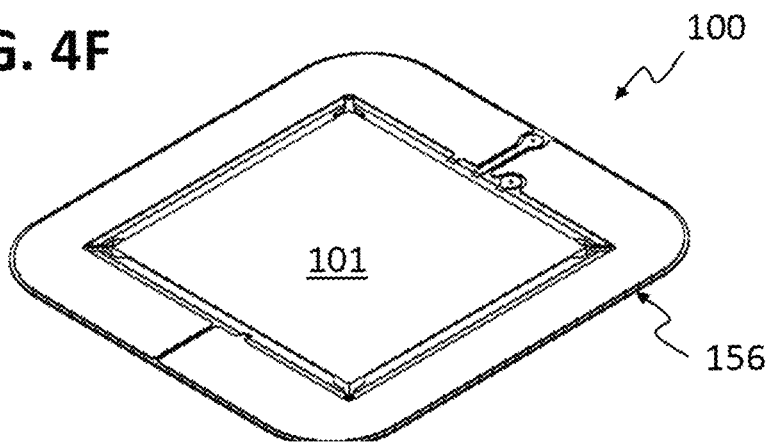

FIGS. 4E and 4F show an optional sealing process, which is explained in greater detail further below.

In various exemplary aspects, the frame 150 can be multi-layered.

The frame 150 can comprise for example an insulation layer (the insulation layer 154 extending right into the frame 150 or a further insulation layer) and, applied thereon, a structured layer of electrically conductive material 142, 146 and/or 154 and/or 240, to which the electrical connections 174 can be coupled. By way of example, the electrical connections 174 and the structured layer of electrically conductive material 142, 146 can be applied on the same side of the insulation layer 154 and can be embodied at least partly as continuous regions.

To put it another way, in various exemplary aspects, the frame 150 can comprise the insulation layer, which can be coated with electrically conductive material on one side or on both sides, for example in the form of the structured layer 142, 146 and/or 154 and optionally the (possibly likewise structured) additional conductive layer 154 and/or 240.

The structured layer 142, 146 and/or 154 and the additional layer 154 and/or 240 can be coupled to one another by means of a via 242 through the insulation layer.

In various exemplary aspects, the additional electrically conductive layer 154 and/or 240 can be constructed, with regard to material, thickness etc., like the structured layer 142, 146 and/or 154 or comprise materials/thicknesses, etc. different therefrom and form the module antenna 154 or the contact pads 240.

In the case of the package 100, the structured layer 142, 146 and/or 154 can comprise an electrically conductive contact region 142 arranged laterally adjacent to the sensor area 101S. The contact region 142 can be formed as a metal area, for example.

The contact region 142 can be configured likewise to be touched upon the contact area 101S being touched by the finger in order to bring the finger to a predetermined potential, for example to a grounding potential (the ring can therefore also be referred to as VSS ring). That may be necessary for operation of the silicon-based, for example capacitive, fingerprint sensor 109.

The contact region 142, in particular in a case where the Coil-on-Module antenna 154 is used, is not permitted to form a closed ring, in order to avoid an inductive disturbance of the antenna, but rather should form an open ring or ring segments. Gaps 172 can be formed for this purpose, for example by means of etching or other suitable methods used for structuring the metallization.

In various exemplary aspects, the contact region 142 can be electrically conductively connected to the chip 110 or a circuit connected thereto.

In various exemplary aspects, the contact region 142 and the antenna 154 can be arranged one vertically above the other, in a manner separated from one another by the electrically insulating substrate (for example the insulation layer 152 extending to there). In various exemplary aspects, the contact region 142 and the antenna 154 can be arranged laterally offset with respect to one another. An electrically conductive bridge 146 for connecting two ends of the antenna 154 can be arranged on the same side as the contact region 142. FIG. 2A shows an exemplary aspect of the carrier component 156 with the antenna 154 on the underside and the contact region 142 on the top side.

In various exemplary aspects, in a case where a gap remains between inner walls of the opening 224 and outer surfaces of the sensor module 101, a filling material 442 can be arranged between the sensor module 101 and the insulation layer 152 (the perpendicular part 152S) connected to the frame 150.

That is illustrated in FIG. 4E and FIG. 4F for a viscose filling material 442 (e.g. a so-called underfill material or a printable paste), which can be introduced into the gap by means of a filling or printing apparatus 441, for example.

Filling the gap makes it possible to avoid accumulation of dust and dirt during a lifetime of the sensor module 101.

In this case, the underfill material can fill the entire gap (as illustrated by way of example in the cross-sectional view in FIG. 6), even optionally between the electrical connections 174 (that cannot be seen in FIG. 6), and can thus increase adhesion between the sensor module 101 and the carrier component 156 and thus a reliability of the electrically conductive connections between the electrical connections 174 and the sensor module connections 103.

In FIGS. 7A and 7B, the filling material 442 used is a so-called Backlack® wire, comprising a metal wire 774, an insulation 772 and a thermally deformable varnish 770 as outermost layer.

The Backlack® wire 442 is brought to the correct length, arranged on the gap, e.g. by means of a pick-and-place process, and pressed into the gap with supply of heat (e.g. by means of a heated thermode). The lacquer 770 that is deformed as a result effects the sealing. Moreover, an upper surface of the Backlack® wire 442 can be in one plane with a surface of the sensor module 101. The Backlack® wire 442 may afford the advantages that the wire entails a certain stiffness, the thermally deformable varnish has good adhesion properties, and the Backlack® wire is widely employed in industry and is therefore readily available.

In various exemplary aspects, instead of the Backlack® wire 442, some other wire- or cord-shaped filling material 442 can be used, for example threads of thermoplastic material such as is used for 3D printing methods, for example. In such an example, a 3D printing process can be used instead of a pick-and-place process.

FIG. 3 shows schematic perspective views of a front side and a rear side of a carrier tape 300 with a plurality of carrier components 156 in accordance with various exemplary aspects.

As already indicated above, one of the advantages of the packages 100 in accordance with various exemplary aspects may reside in the fact that they can be provided in a way that allows processing with machines and tools used in the relevant industry (e.g. chip card production). Some of the descriptions of the packages 100 are applicable to the carrier tape 300, and vice versa, and so repetitions are dispensed with in some instances.

In various exemplary aspects, a carrier tape 300 comprising a plurality of packages 100 in accordance with various exemplary aspects can be provided. For the sake of clarity, the way in which the sensor module 101 is arranged is indicated only for one of the carrier tape components 156, but in principle the process illustrated in FIGS. 4A to 4D (optionally to FIG. 4F) is carried out at the carrier tape level and each of the carrier tape components 156 is filled with a sensor module 101.

The carrier tape 300 can be formed as a standard 35 mm carrier tape for roll-to-roll production of chip modules. That should be understood to mean that the carrier tape 300 satisfies those specifications which are required in order that the carrier tape 300 can be used by means of roll-to-roll production devices currently used in the production of chip modules. Furthermore, the carrier tape 300 can be designed, however, such that it provides the functionality described herein for the package 100, for example the upper and optionally lower metallization, optionally through contacts for attaching the metallization(s), etc.

The carrier tape 300 can comprise a carrier tape body 320 having a plurality of (for example stamped) through openings 170 and gaps 230 or openings 880, 886 for producing the predetermined breaking lines 884.

The carrier tape 300 can comprise a substrate 320, which can comprise the insulation layer 152 for the plurality of carrier components 156, which layer can optionally extend right into the respective frame 150. The substrate 320 can be for example a reinforced epoxy tape, a PET tape or a polyimide tape.

An upper metallization can be arranged on the substrate 320, and can be structured in order to form the structured layer 142, 146 and/or 154 and the electrical connections 174 for each of the carrier components 156. Furthermore, a lower metallization can be arranged and can be structured in order to form the antenna 154 or the contact pads 240 for each of the carrier components 156. The upper metallization and the lower metallization can comprise copper (Cu) for example, which can be coated for example with nickel (Ni), gold (Au), palladium (Pd) or for example a CuSnZn alloy (e.g. MIRALLOY®) or other alloys thereof. The metallization can comprise the same materials or different materials on the top side and on the underside.

The metal area 142 can serve for example as a mounting area, as a definition for where the package 100 to be singulated from the carrier tape 300 ends, and/or for mechanical stabilization. Optionally, for example for protection against electrostatic charge, grounding potential can be applied to the metal area 142.

Figure 10:
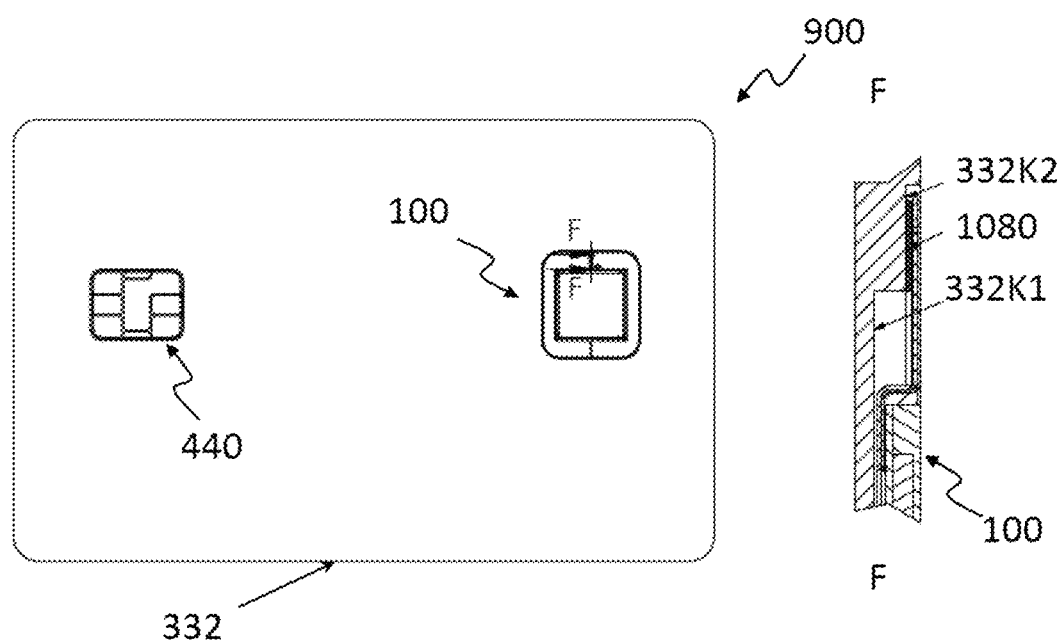
FIG. 10 shows a schematic plan view of a chip card in accordance with various exemplary aspects with a cross-sectional view of a partial region.

FIG. 9 shows schematic perspective views of a chip card 900 in accordance with various exemplary aspects, and FIG. 10 shows a schematic plan view of a chip card 900 in accordance with various exemplary aspects with a cross-sectional view of a partial region.

After the sensor module 101 has been connected to the carrier component 156, the package 100 formed as a result can be embedded into a chip card body 332 for the purpose of forming a chip card 900.

For this purpose, the package 100 can be stamped out from a carrier tape 300 in a conventional roll-to-roll method and can be embedded into the chip card body 332 by means of a hot melt process.

In the region of the ring 150, the package 100 can be configured to be arranged in a first cavity Z1 in the chip card body 330 and to be secured there.

The second, thicker part of the package 100, which part accommodates the sensor module 101, can be arranged in a second (deeper) cavity Z2.

The exemplary package 100a can be formed as the Coil-on-Module package 100a and thus comprise the antenna 154.

The antenna 154 of the package 100 and a booster antenna 330, to put it more precisely a coupling region 330K of the booster antenna 330, can be aligned with one another in the chip card 900 such that a coupling strength necessary for operating the package 100 as part of the chip card 900 is achieved.

As is illustrated in FIG. 9, in various exemplary aspects, the chip card 900 can furthermore comprise a contact-based chip module 440, which is not electrically connected to the package 100. The contact-based chip module 440 can comprise a dedicated secure element for contact-based operation of the chip card 900. The secure element of the contact-based chip module 440 can be independent of the secure element 110 of the package 100.

FIG. 12 shows a flow diagram 1200 of a method for forming a package in accordance with various exemplary aspects.

The method comprises forming an insulation layer with a plurality of electrical connections at a frame (at 1210), and bending the insulation layer with the electrical connections along the frame in order to form an opening for receiving a sensor module, such that the frame comprises a plurality of electrical connections which are directed into the opening and which are arranged on the insulation layer, wherein at least one electrical connection of the electrical connections is electrically couplable to an associated sensor module connection of the sensor module, and wherein the at least one electrical connection is couplable to the associated sensor module connection in an arrangement in which the sensor module connection faces the at least one electrical connection (at 1220).

Some exemplary aspects are specified in summary below.

Exemplary aspect 1 is a package comprising a frame having an opening for receiving a sensor module, wherein the frame comprises at least one electrical connection which is directed into the opening and which is arranged on an insulation layer applied to the frame, wherein the insulation layer is connected to the frame at an insertion side of the frame, from which side the sensor module is to be inserted into the opening, and is bent along the inner side of the frame proceeding from the insertion side, such that the at least one electrical connection directed to the opening is electrically couplable to the associated sensor module connection in an arrangement, wherein optionally the at least one electrical connection is couplable to the associated sensor module connection in the arrangement in which the sensor module connection faces the at least one electrical connection.

Exemplary aspect 2 is a package in accordance with exemplary aspect 1, furthermore comprising a sensor module having a sensor and at least one sensor module connection, wherein the sensor module is arranged in the opening.

Exemplary aspect 3 is a package in accordance with exemplary aspect 1 or 2, wherein the insulation layer comprises a through opening and a plurality of slots or predetermined breaking lines extending from the through opening in the direction toward the frame.

Exemplary aspect 4 is a package in accordance with exemplary aspect 1 or 2, wherein the insulation layer comprises a plurality of slots extending from a central region of the insulation layer in the direction toward the frame.

Exemplary aspect 5 is a package in accordance with any of exemplary aspects 1 to 4, wherein the insulation layer comprises at least one section which comprises at the frame a perpendicular part extending substantially perpendicular to the frame, and at the perpendicular part a parallel part extending substantially parallel to the frame.

Exemplary aspect 6 is a package in accordance with exemplary aspect 5, wherein the at least one section comprises a plurality of sections.

Exemplary aspect 7 is a package in accordance with exemplary aspect 6, wherein the plurality of sections comprises two sections situated opposite one another or three or more sections.

Exemplary aspect 8 is a package in accordance with any of exemplary aspects 1 to 7, wherein the opening has an area that forms a polygon.

Exemplary aspect 6 is a package in accordance with exemplary aspect 6 or 7 and 8, wherein at least of the sections is arranged at each side of the polygon.

Exemplary aspect 10 is a package in accordance with any of exemplary aspects 5 to 9, wherein a height (H) of the perpendicular part corresponds to a thickness of the sensor module, such that the sensor module is positionable flush with the frame in the opening.

Exemplary aspect 11 is a package in accordance with any of exemplary aspects 1 to 10, furthermore comprising contact pads arranged on the frame and coupled to the electrical connections.

Exemplary aspect 12 is a package in accordance with exemplary aspect 11, wherein the contact pads are arranged on that side of the frame into which extends the opening or the part of the insulation layer forming the opening.

Exemplary aspect 13 is a package in accordance with any of exemplary aspects 1 to 10, furthermore comprising an antenna arranged on the frame and coupled to the electrical connections.

Exemplary aspect 14 is a package in accordance with exemplary aspect 13, wherein the antenna is configured for coupling to a booster antenna.

Exemplary aspect 15 is a package in accordance with any of exemplary aspects 1 to 14, wherein the insulation layer and the at least one electrical connection are bendable.

Exemplary aspect 16 is a package in accordance with exemplary aspect 15, wherein a material and a layer thickness of the insulation layer are configured such that the bent region has a neutral axis that was neither lengthened nor shortened during bending.

Exemplary aspect 17 is a package in accordance with exemplary aspect 16, wherein the insulation layer comprises a polymer, for example polyimide.

Exemplary aspect 18 is a package in accordance with any of exemplary aspects 15 to 17, wherein a material and/or a layer thickness of the at least one electrical connection are/is chosen in such a way as to remain electrically conductive in the bent region.

Exemplary aspect 19 is a package in accordance with any of exemplary aspects 1 to 18, wherein the frame is multi-layered.

Exemplary aspect 20 is a package in accordance with any of exemplary aspects 1 to 19, wherein the frame comprises an insulation layer and applied thereon a structured layer of electrically conductive material, to which the at least one electrical connection is coupled.

Exemplary aspect 21 is a package in accordance with exemplary aspect 20, wherein the frame furthermore comprises an additional layer of electrically conductive material, which is arranged on an opposite side of the frame relative to the structured layer.

Exemplary aspect 22 is a package in accordance with exemplary aspect 21, wherein the structured layer and the additional layer are coupled to one another by means of a via through the insulation layer.

Exemplary aspect 23 is a package in accordance with any of exemplary aspects 2 to 22, wherein the sensor module comprises a biometric sensor, for example a fingerprint sensor.

Exemplary aspect 24 is a package in accordance with exemplary aspect 23, wherein the sensor module comprises a sensor chip for processing sensor data detected by means of the sensor.

Exemplary aspect 25 is a package in accordance with exemplary aspect 24, wherein the sensor module furthermore comprises an additional chip, for example a secure element, and/or additional active and/or passive components.

Exemplary aspect 26 is a package in accordance with any of exemplary aspects 1 to 25, further comprising filling material between the sensor module and the insulation layer connected to the frame.

Exemplary aspect 27 is a package in accordance with any of exemplary aspects 1 to 26, wherein the at least one electrical connection comprises at least two electrical connections configured in redundant fashion for transferring the same signal.

Exemplary aspect 28 is a carrier tape comprising a plurality of packages in accordance with any of exemplary aspects 1 to 27.

Exemplary aspect 29 is a chip card comprising a chip card body and a package in accordance with any of exemplary aspects 1 to 27 embedded into the chip card body.

Exemplary aspect 30 is a chip card in accordance with exemplary aspect 29, comprising a booster antenna embedded into the chip card body with a coupling region for inductive coupling to an antenna of the package.

Exemplary aspect 31 is a method for forming a package. The method comprises forming an insulation layer with at least one electrical connection at a frame, and bending the insulation layer with the electrical connection along the frame in order to form an opening for receiving a sensor module, such that the frame comprises at least one electrical connection which is directed into the opening and which is arranged on the insulation layer, wherein the electrical connection is electrically couplable to an associated sensor module connection of the sensor module, and wherein optionally the at least one electrical connection is couplable to the associated sensor module connection in an arrangement in which the sensor module connection faces the at least one electrical connection.

Exemplary aspect 32 is a method in accordance with exemplary aspect 31, furthermore comprising arranging a sensor module having a sensor and at least one sensor module connection in the opening.

Exemplary aspect 33 is a method in accordance with exemplary aspect 31 or 32, wherein the insulation layer comprises a through opening and a plurality of slots or predetermined breaking lines extending from the through opening in the direction toward the frame.

Exemplary aspect 34 is a method in accordance with exemplary aspect 31 or 32, wherein the insulation layer comprises a plurality of slots extending from a central region of the insulation layer in the direction toward the frame.

Exemplary aspect 35 is a method in accordance with any of exemplary aspects 31 to 34, wherein the insulation layer comprises at least one section which comprises at the frame a perpendicular part extending substantially perpendicular to the frame, and at the perpendicular part a parallel part extending substantially parallel to the frame.

Exemplary aspect 36 is a method in accordance with exemplary aspect 35, wherein the at least one section comprises a plurality of sections.

Exemplary aspect 37 is a method in accordance with exemplary aspect 36, wherein the plurality of sections comprises two sections situated opposite one another or three or more sections.

Exemplary aspect 38 is a method in accordance with any of exemplary aspects 31 to 37, wherein the opening has an area that forms a polygon.

Exemplary aspect 39 is a method in accordance with exemplary aspect 36 or 37 and exemplary aspect 38, wherein one of the sections is arranged at each side of the polygon.

Exemplary aspect 40 is a method in accordance with any of exemplary aspects 35 to 39, wherein a height (H) of the perpendicular part corresponds to a thickness of the sensor module, such that the sensor module is positionable flush with the frame in the opening.

Exemplary aspect 41 is a method in accordance with any of exemplary aspects 31 to 40, furthermore comprising arranging contact pads on the frame and coupling the contact pads to the at least one electrical connection.

Exemplary aspect 42 is a method in accordance with exemplary aspect 41, wherein the contact pads are arranged on that side of the frame into which extends the opening or the part of the insulation layer that forms the opening.

Exemplary aspect 43 is a method in accordance with any of exemplary aspects 31 to 40, furthermore comprising arranging an antenna on the frame and coupling the antenna to the at least one electrical connection.

Exemplary aspect 44 is a method in accordance with exemplary aspect 43, wherein the antenna is configured for coupling to a booster antenna.

Exemplary aspect 45 is a method in accordance with any of exemplary aspects 31 to 44, wherein the insulation layer and the at least one electrical connection are bendable.

Exemplary aspect 46 is a method in accordance with exemplary aspect 45, wherein a material and a layer thickness of the insulation layer are configured such that the bent region has a neutral axis that was neither lengthened nor shortened during bending.

Exemplary aspect 47 is a method in accordance with exemplary aspect 46, wherein the insulation layer comprises a polymer, for example polyimide.

Exemplary aspect 48 is a method in accordance with any of exemplary aspects 45 to 47, wherein a material and/or a layer thickness of the at least one electrical connection are/is chosen in such a way as to remain electrically conductive in the bent region.

Exemplary aspect 49 is a method in accordance with any of exemplary aspects 31 to 48, wherein the frame is multi-layered.

Exemplary aspect 50 is a method in accordance with any of exemplary aspects 31 to 49, wherein the frame comprises an insulation layer and applied thereon a structured layer of electrically conductive material, to which the at least one electrical connection is coupled.

Exemplary aspect 51 is a method in accordance with exemplary aspect 50, furthermore comprising forming an additional layer of electrically conductive material on an opposite side of the frame relative to the structured layer.

Exemplary aspect 52 is a method in accordance with exemplary aspect 51, furthermore comprising coupling the structured layer and the additional layer to one another by means of a via through the insulation layer.

Exemplary aspect 53 is a method in accordance with any of exemplary aspects 32 to 52, wherein the sensor module comprises a biometric sensor, for example a fingerprint sensor.

Exemplary aspect 54 is a method in accordance with exemplary aspect 53, wherein the sensor module comprises a sensor chip for processing sensor data detected by means of the sensor.

Exemplary aspect 55 is a method in accordance with exemplary aspect 54, wherein the sensor module furthermore comprises an additional chip, for example a secure element, and/or additional active and/or passive components.

Exemplary aspect 56 is a method in accordance with any of exemplary aspects 31 to 55, furthermore comprising arranging filling material between the sensor module and the insulation layer connected to the frame.

Exemplary aspect 57 is a method in accordance with any of exemplary aspects 31 to 56, wherein the at least one electrical connection comprises at least two electrical connections configured in redundant fashion for transferring the same signal.

Exemplary aspect 58 is a method for forming a carrier tape, comprising forming a plurality of packages in accordance with any of exemplary aspects 31 to 57 in a carrier tape body.

Exemplary aspect 59 is a method for forming a chip card, comprising embedding a package in accordance with any of claims 1 to 17 into a chip card body.

Exemplary aspect 60 is a method in accordance with exemplary aspect 59, furthermore comprising embedding a booster antenna with a coupling region for inductive coupling to an antenna of the package into the chip card body.

Exemplary aspect 61 is a package in accordance with exemplary aspect 21, wherein the layer of electrically conductive material is formed exclusively in a region extending from an outer edge of the carrier component as far as a distance L1 from an intersection line formed by a plane running along the carrier component outside a region surrounding the convexly shaped opening and a lateral surface of the convexly shaped part of the carrier component.

Exemplary aspect 62 is a package in accordance with exemplary aspect 61, wherein the distance L1 is between 50 µm and 300 µm.

Further advantageous configurations of the device are evident from the description of the method, and vice versa.

The invention claimed is:

1. A package, comprising:
a frame having an opening for receiving a sensor module, wherein the frame comprises at least one electrical connection which is directed into the opening and which is arranged on an insulation layer applied to the frame,
wherein the insulation layer is connected to the frame at an insertion side of the frame, from which side the sensor module is to be inserted into the opening, and is bent along the inner side of the frame proceeding from the insertion side, such that the at least one electrical connection directed to the opening is electrically couplable to the associated sensor module connection in an arrangement.

2. The package as claimed in claim 1, further comprising:
the sensor module having a sensor and at least one sensor module connection, wherein the sensor module is arranged in the opening.

3. The package as claimed in claim 1,
wherein the insulation layer comprises a through-opening and a plurality of slots or predetermined breaking lines extending from the through opening in the direction toward the frame, or comprises a plurality of slots extending from a central region of the insulation layer in the direction toward the frame.

4. The package as claimed in claim 1,
wherein the insulation layer comprises at least one section which comprises at the frame a perpendicular part extending substantially perpendicular to the frame, and at the perpendicular part a parallel part extending substantially parallel to the frame.

5. The package as claimed in claim 4,
wherein the at least one section comprises a plurality of sections.

6. The package as claimed in claim 1, further comprising:
contact pads arranged on the frame and coupled to the at least one electrical connection.

7. The package as claimed in claim 1, further comprising:
an antenna arranged on the frame and coupled to the at least one electrical connection.

8. The package as claimed in claim 1,
wherein the insulation layer and the at least one electrical connection are bendable.

9. The package as claimed in claim 8,
wherein a material and a layer thickness of the insulation layer are configured such that the bent region has a neutral axis that was neither lengthened nor shortened during bending.

10. The package as claimed in claim 8,
wherein a material and/or a layer thickness of the at least one electrical connection are/is chosen in such a way as to remain electrically conductive in the bent region.

11. The package as claimed in claim 1,
wherein the frame comprises an insulation layer and applied thereon a structured layer of electrically conductive material, to which the at least one electrical connection is coupled.

12. The package as claimed in claim 11,
wherein the frame further comprises an additional layer of electrically conductive material, which is arranged on an opposite side of the frame relative to the structured layer.

13. The package as claimed in claim 1, further comprising:
filling material between the sensor module and the insulation layer connected to the frame.

14. The package as claimed in claim 1,
wherein the at least one electrical connection comprises at least two electrical connections configured in redundant fashion for transferring the same signal.

15. The package as claimed in claim 12,
wherein the layer of electrically conductive material is formed exclusively in a region extending from an outer edge of the carrier component as far as a distance from an intersection line formed by a plane running along the carrier component outside a region surrounding the convexly shaped opening and a lateral surface of the convexly shaped part of the carrier component.

16. The package as claimed in claim 15,
wherein the distance is between 50 μm and 300 μm.

17. A carrier tape, comprising:
a plurality of packages as claimed in claim 1.

18. A chip card, comprising:
a chip card body; and
a package as claimed in claim 1 embedded into the chip card body.

* * * * *